(12) United States Patent
O'Young et al.

(10) Patent No.: US 11,706,894 B2
(45) Date of Patent: *Jul. 18, 2023

(54) CABLE MANAGER WITH A HINGED DOOR

(71) Applicant: Panduit Corp., Tinley Park, IL (US)

(72) Inventors: Jason O'Young, Tinley Park, IL (US); Kevin M. Zumbek, Chicago, IL (US)

(73) Assignee: Panduit Corp., Tinley Park, IL (US)

( * ) Notice: Subject to any disclaimer, the term of this patent is extended or adjusted under 35 U.S.C. 154(b) by 197 days.

This patent is subject to a terminal disclaimer.

(21) Appl. No.: 17/179,718

(22) Filed: Feb. 19, 2021

(65) Prior Publication Data

US 2021/0176888 A1 Jun. 10, 2021

Related U.S. Application Data

(63) Continuation-in-part of application No. 16/937,920, filed on Jul. 24, 2020, now Pat. No. 11,582,538.

(60) Provisional application No. 62/882,736, filed on Aug. 5, 2019.

(51) Int. Cl.
*H05K 7/14* (2006.01)

(52) U.S. Cl.
CPC ................... *H05K 7/1491* (2013.01)

(58) Field of Classification Search
None
See application file for complete search history.

(56) References Cited

U.S. PATENT DOCUMENTS

| 4,406,379 A * | 9/1983 | Anderson | H02G 3/0431 220/829 |
| 4,645,292 A * | 2/1987 | Sammueller | G02B 6/3839 385/59 |
| 5,210,906 A * | 5/1993 | Aihara | E05D 1/06 16/272 |
| 5,442,726 A * | 8/1995 | Howard | H04Q 1/10 385/136 |
| 5,728,976 A * | 3/1998 | Santucci | H02G 3/0418 174/68.3 |
| 5,971,508 A * | 10/1999 | Deimen | A47B 97/00 108/50.02 |
| 5,971,509 A * | 10/1999 | Deimen | H02G 3/0437 108/26 |

(Continued)

FOREIGN PATENT DOCUMENTS

CN 111864661 A * 10/2020
EP 0555187 A1 * 2/1993
(Continued)

*Primary Examiner* — Timothy J. Dole
*Assistant Examiner* — Muhammed Azam
(74) *Attorney, Agent, or Firm* — Christopher S. Clancy; James H. Williams; Aimee E. McVady

(57) ABSTRACT

A cable manager connected to a network rack that routes cables in and around the network rack. The cable manager includes a body with plurality of fingers extending from the body. The distal end of at least one finger includes a hinge pin holder. The cable manager also includes a door hingedly attached to the fingers extending from the body. The door has a front, a back, edges, and at least one hinge pin receptacle positioned along the edges of the door. The hinge pin receptacle houses a magnet to enable the door to attach to the hinge pin holder of the at least one finger to hold the door in a closed position.

13 Claims, 30 Drawing Sheets

(56) References Cited

U.S. PATENT DOCUMENTS

| | | | |
|---|---|---|---|
| 6,283,247 B1 * | 9/2001 | McGrath | B44C 7/022 |
| | | | 181/295 |
| 6,381,393 B1 * | 4/2002 | Matthews | H04Q 1/066 |
| | | | 385/134 |
| 6,437,243 B1 * | 8/2002 | VanderVelde | H02G 3/0418 |
| | | | 174/101 |
| 6,541,705 B1 * | 4/2003 | McGrath | H05K 7/186 |
| | | | 174/101 |
| 6,766,093 B2 * | 7/2004 | McGrath | H04Q 1/064 |
| | | | 379/327 |
| 6,884,942 B2 | 4/2005 | McGrath et al. | |
| 6,903,265 B1 * | 6/2005 | VanderVelde | H02G 3/0418 |
| | | | 174/68.3 |
| 7,000,784 B2 * | 2/2006 | Canty | H04Q 1/064 |
| | | | 211/26 |
| 7,013,530 B2 * | 3/2006 | Lallemant | G06F 1/1616 |
| | | | 16/297 |
| 7,018,245 B2 * | 3/2006 | Baker | H04Q 1/062 |
| | | | 439/718 |
| 7,060,893 B1 * | 6/2006 | Villi | H02G 3/0418 |
| | | | 248/68.1 |
| 7,060,901 B2 * | 6/2006 | Herzog | H02G 3/0418 |
| | | | 174/135 |
| 7,113,685 B2 * | 9/2006 | Ferris | H02G 9/04 |
| | | | 248/68.1 |
| 7,119,280 B1 * | 10/2006 | Ray | H02G 3/18 |
| | | | 174/72 A |
| 7,121,412 B2 * | 10/2006 | Richards | H04Q 1/09 |
| | | | 211/26 |
| 7,178,679 B2 | 2/2007 | Canty et al. | |
| 7,285,027 B2 | 10/2007 | McGrath et al. | |
| 7,362,941 B2 | 4/2008 | Rinderer et al. | |
| 7,378,046 B2 | 5/2008 | Canty et al. | |
| 7,458,859 B2 | 12/2008 | McGrath et al. | |
| 7,496,268 B2 * | 2/2009 | Escoto | G02B 6/4441 |
| | | | 385/136 |
| 7,525,044 B2 * | 4/2009 | Howell | H02G 3/0418 |
| | | | 138/155 |
| D596,928 S * | 7/2009 | Lawrence | D8/356 |
| D602,764 S * | 10/2009 | Pae | D8/356 |
| 7,612,300 B2 * | 11/2009 | Owens | G02B 6/4459 |
| | | | 174/72 A |
| 7,628,644 B1 * | 12/2009 | Peluffo | H01R 13/518 |
| | | | 439/540.1 |
| 7,695,323 B2 | 4/2010 | McGrath et al. | |
| 7,760,984 B2 * | 7/2010 | Solheid | G02B 6/445 |
| | | | 385/134 |
| 7,762,405 B2 | 7/2010 | Vogel et al. | |
| 7,857,670 B2 | 12/2010 | McGrath et al. | |
| D630,167 S * | 1/2011 | Donowho | D13/155 |
| 7,893,356 B2 | 2/2011 | Garza et al. | |
| D635,935 S * | 4/2011 | Donowho | D13/155 |
| 7,939,763 B2 * | 5/2011 | Jones | H02G 3/0456 |
| | | | 174/101 |
| 7,973,242 B2 | 7/2011 | Jones et al. | |
| 7,999,183 B2 | 8/2011 | Garza et al. | |
| 8,014,171 B2 * | 9/2011 | Kelly | H04Q 1/064 |
| | | | 361/825 |
| 8,024,839 B2 * | 9/2011 | Lewis, II | E05D 11/105 |
| | | | 16/334 |
| 8,059,931 B2 * | 11/2011 | Russell | G02B 6/4452 |
| | | | 385/134 |
| 8,138,419 B2 | 3/2012 | Garza et al. | |
| 8,162,699 B2 | 4/2012 | McGrath et al. | |
| 8,217,266 B2 * | 7/2012 | Caveney | H02G 3/0418 |
| | | | 174/72 A |
| 8,229,265 B2 * | 7/2012 | Solheid | G02B 6/483 |
| | | | 385/139 |
| 8,242,364 B1 | 8/2012 | Shotey et al. | |
| 8,246,382 B1 * | 8/2012 | Ku | H04Q 1/131 |
| | | | 439/540.1 |
| 8,263,867 B2 | 9/2012 | Garza et al. | |
| 8,273,989 B2 | 9/2012 | Garza et al. | |
| 8,330,043 B2 | 12/2012 | Alaniz et al. | |
| 8,363,998 B2 | 1/2013 | Newman et al. | |
| 8,435,086 B2 | 5/2013 | McGrath et al. | |
| 8,457,464 B2 | 6/2013 | O'Connor | |
| 8,488,936 B2 * | 7/2013 | Sayres | G02B 6/4459 |
| | | | 174/481 |
| 8,558,113 B2 * | 10/2013 | Krietzman | H02G 3/045 |
| | | | 174/72 A |
| 8,576,580 B2 | 11/2013 | Kelly et al. | |
| 8,710,369 B2 * | 4/2014 | Krietzman | H05K 5/0247 |
| | | | 174/68.3 |
| 8,881,916 B2 | 11/2014 | Vogel et al. | |
| 9,054,506 B2 | 6/2015 | Krietzman et al. | |
| 9,178,342 B2 * | 11/2015 | Rodenberg | H02G 3/0425 |
| 9,212,765 B1 * | 12/2015 | Chia | F16L 3/127 |
| 9,270,097 B2 | 2/2016 | Krietzman et al. | |
| 9,350,146 B2 | 5/2016 | Krietzman et al. | |
| 9,372,318 B2 * | 6/2016 | Veatch | G02B 6/445 |
| 9,577,414 B2 | 2/2017 | Krietzman et al. | |
| 9,720,195 B2 * | 8/2017 | Giraud | G02B 6/4452 |
| 9,784,936 B2 * | 10/2017 | Grandidge | G02B 6/4452 |
| 9,814,150 B2 | 11/2017 | Krietzman et al. | |
| 9,851,524 B2 * | 12/2017 | Vongseng | G02B 6/4455 |
| 9,899,812 B2 | 2/2018 | Krietzman et al. | |
| 10,076,054 B2 * | 9/2018 | Goergen | G02B 6/4471 |
| 10,088,097 B2 * | 10/2018 | Hermey | H02G 3/263 |
| 10,141,728 B1 * | 11/2018 | Valenti | H02B 1/44 |
| 10,320,163 B2 | 6/2019 | Krietzman et al. | |
| 10,433,031 B1 * | 10/2019 | Hudgens | H04Q 1/066 |
| 10,694,265 B2 * | 6/2020 | Sticker | H04Q 1/064 |
| 10,714,915 B2 | 7/2020 | Valenti et al. | |
| 10,862,283 B1 * | 12/2020 | Hansen | H02G 3/0437 |
| 2001/0031124 A1 * | 10/2001 | McGrath | H04Q 1/068 |
| | | | 385/134 |
| 2002/0168065 A1 * | 11/2002 | Sajadi | H04Q 1/14 |
| | | | 379/428.01 |
| 2002/0197045 A1 * | 12/2002 | Schmidt | G02B 6/4471 |
| | | | 385/134 |
| 2003/0070258 A1 * | 4/2003 | Nhep | E05D 15/507 |
| | | | 16/232 |
| 2004/0060584 A1 * | 4/2004 | Diggle | H04Q 1/025 |
| | | | 135/16 |
| 2004/0173545 A1 * | 9/2004 | Canty | H04Q 1/062 |
| | | | 361/826 |
| 2004/0206532 A1 | 10/2004 | McGrath et al. | |
| 2005/0006324 A1 * | 1/2005 | Richards | H05K 7/186 |
| | | | 211/183 |
| 2005/0111810 A1 * | 5/2005 | Giraud | G02B 6/4455 |
| | | | 385/135 |
| 2005/0115737 A1 * | 6/2005 | Levesque | H02G 3/0493 |
| | | | 174/100 |
| 2005/0221683 A1 * | 10/2005 | McGrath | H02G 3/0406 |
| | | | 439/701 |
| 2005/0247478 A1 * | 11/2005 | McGrath | H04Q 1/064 |
| | | | 174/68.1 |
| 2005/0247650 A1 * | 11/2005 | Vogel | H04Q 1/13 |
| | | | 211/26 |
| 2007/0054528 A1 * | 3/2007 | Caveney | H01R 9/2416 |
| | | | 439/244 |
| 2007/0084618 A1 * | 4/2007 | VanderVelde | H02G 3/128 |
| | | | 174/72 A |
| 2007/0210680 A1 * | 9/2007 | Appino | H04Q 1/066 |
| | | | 312/7.2 |
| 2007/0227756 A1 * | 10/2007 | Doerr | H05K 7/1491 |
| | | | 174/69 |
| 2007/0293138 A1 * | 12/2007 | Adducci | H05K 7/1488 |
| | | | 454/184 |
| 2008/0121423 A1 * | 5/2008 | Vogel | H05K 7/1491 |
| | | | 174/480 |
| 2008/0123301 A1 * | 5/2008 | Vogel | H04Q 1/064 |
| | | | 361/725 |
| 2008/0151524 A1 * | 6/2008 | Kelly | H04Q 1/064 |
| | | | 361/826 |
| 2009/0090533 A1 * | 4/2009 | Jones | H02G 3/30 |
| | | | 174/95 |
| 2009/0189026 A1 * | 7/2009 | Bourgeois | H02G 3/0456 |
| | | | 248/70 |

(56) References Cited

U.S. PATENT DOCUMENTS

| | | | |
|---|---|---|---|
| 2009/0200057 A1* | 8/2009 | Caveney | H02G 3/045 174/101 |
| 2009/0263096 A1* | 10/2009 | Solheid | G02B 6/483 385/135 |
| 2010/0109493 A1* | 5/2010 | Fargeau | H04B 1/082 312/7.1 |
| 2010/0301720 A1* | 12/2010 | Anderson | E05F 5/02 312/319.2 |
| 2011/0174534 A1* | 7/2011 | Krietzman | H04Q 1/064 174/520 |
| 2011/0265384 A1* | 11/2011 | Fritz | H02G 3/0418 49/394 |
| 2013/0077927 A1* | 3/2013 | O'Connor | G02B 6/4452 385/135 |
| 2013/0084050 A1* | 4/2013 | Vastmans | H04Q 1/025 361/679.01 |
| 2017/0290192 A1* | 10/2017 | Goergen | G02B 6/4478 |
| 2018/0020569 A1* | 1/2018 | Wang | H05K 7/186 |
| 2018/0167700 A1* | 6/2018 | Sticker | H04Q 1/064 |
| 2018/0299064 A1* | 10/2018 | Hall | F16M 13/027 |
| 2019/0098790 A1 | 3/2019 | Mordick | |
| 2019/0296530 A1 | 9/2019 | Krietman et al. | |
| 2021/0044876 A1* | 2/2021 | O'Young | H04Q 1/064 |
| 2021/0176888 A1* | 6/2021 | O'Young | H02G 3/0456 |

FOREIGN PATENT DOCUMENTS

| | | | | |
|---|---|---|---|---|
| EP | 2805195 | A1 | 11/2014 | |
| KR | 102037261 | B1 * | 10/2019 | |
| WO | WO-02089499 | A2 * | 11/2002 | H04Q 1/021 |
| WO | WO-2009032329 | A1 * | 3/2009 | H02G 3/0456 |
| WO | WO-2011088438 | A2 * | 7/2011 | F16L 3/26 |

\* cited by examiner

CABLE MANAGER WITH A HINGED DOOR

CROSS REFERENCE TO RELATED APPLICATIONS

This application is a continuation-in-part of U.S. patent application Ser. No. 16/937,920, filed on Jul. 24, 2020, which claims benefit to U.S. Provisional Patent Application Ser. No. 62/882,736, filed on Aug. 5, 2019, the entirety of which is hereby incorporated by reference herein.

FIELD OF THE INVENTION

The present invention relates to a horizontal cable manager, and more particularly to a horizontal cable manager with a magnetic hinged door. The present invention also relates to a vertical cable manager with a magnetic hinged door.

BACKGROUND OF THE INVENTION

FIG. 1 illustrates prior art horizontal cable managers 80 mounted to a rack 50 positioned adjacent to a vertical cable manager 100. The horizontal cable managers 80 are visually mismatched because the vertical cable manager 100 includes finger projections that have an increased length. As a result, the front face of the horizontal cable managers 80 is set back from the front face of the vertical cable managers 100.

FIG. 2 illustrates a side view of the prior art horizontal cable manager 80. The top and bottom of the horizontal cable manager include molded-in hinge receptacles. The hinge receptacle receives an extruded plastic door or a metallic door with plastic snap-in hinge elements. The opening and closing of this hinge door require a considerable amount of force.

As a result, it would be desirable to provide a horizontal cable manager with improved aesthetics including longer finger projections to match the vertical cable manager. It is also desirable to provide a horizontal cable manager with an improved hinge door that requires less force to open and close. It is also desirable to provide a vertical cable manager with an improved hinge door.

SUMMARY OF THE INVENTION

A horizontal cable manager routes cables in and around a network rack. The horizontal cable manager includes a body with a back and a plurality of fingers extending from the back of the body. The plurality of fingers is arranged in an upper row extending from an upper portion of the back and a lower row extending from a lower portion of the back. The upper row of fingers and the lower row of fingers are parallel to each other to create a pathway for routing the cables therein. The distal end of at least one finger has a hinge pin holder or a cable management flag. The horizontal cable manager also includes a door hingedly attached to the fingers extending from the body. The door has a front, a back, a top edge, a bottom edge, and at least one hinge pin receptacle positioned along the top edge or the bottom edge of the door. The hinge pin receptacle houses a magnet for enabling the door to attach to the hinge pin holder of the at least one finger to hold the door in a closed position.

Another aspect of the invention is a cable manager that routes cables in a network rack. The cable manager has a body and a door. The body has a plurality of fingers wherein a distal end of at least one finger has a hinge pin holder. The door is hingedly attached to the fingers extending from the body. The door has a front, a back, and at least one hinge pin receptacle positioned along at least one edge of the door. The hinge pin receptacle houses a magnet for enabling the door to attach to the hinge pin holder of the finger to hold the door in a closed position.

Another aspect of the invention is a vertical cable manager that routes cable in a network rack. The vertical cable manager has finger assemblies that include vertically joined finger segments. The finger segments have a center spine with a plurality of fingers and a plurality of hinged fingers extending from at least one edge of the center spine. The vertical cable manager also includes cross members that laterally join the finger assemblies. The vertical cable manager also includes doors hingedly attached to the hinged fingers extending from the center spine of the finger segments.

DETAILED DESCRIPTION

Figure 1:
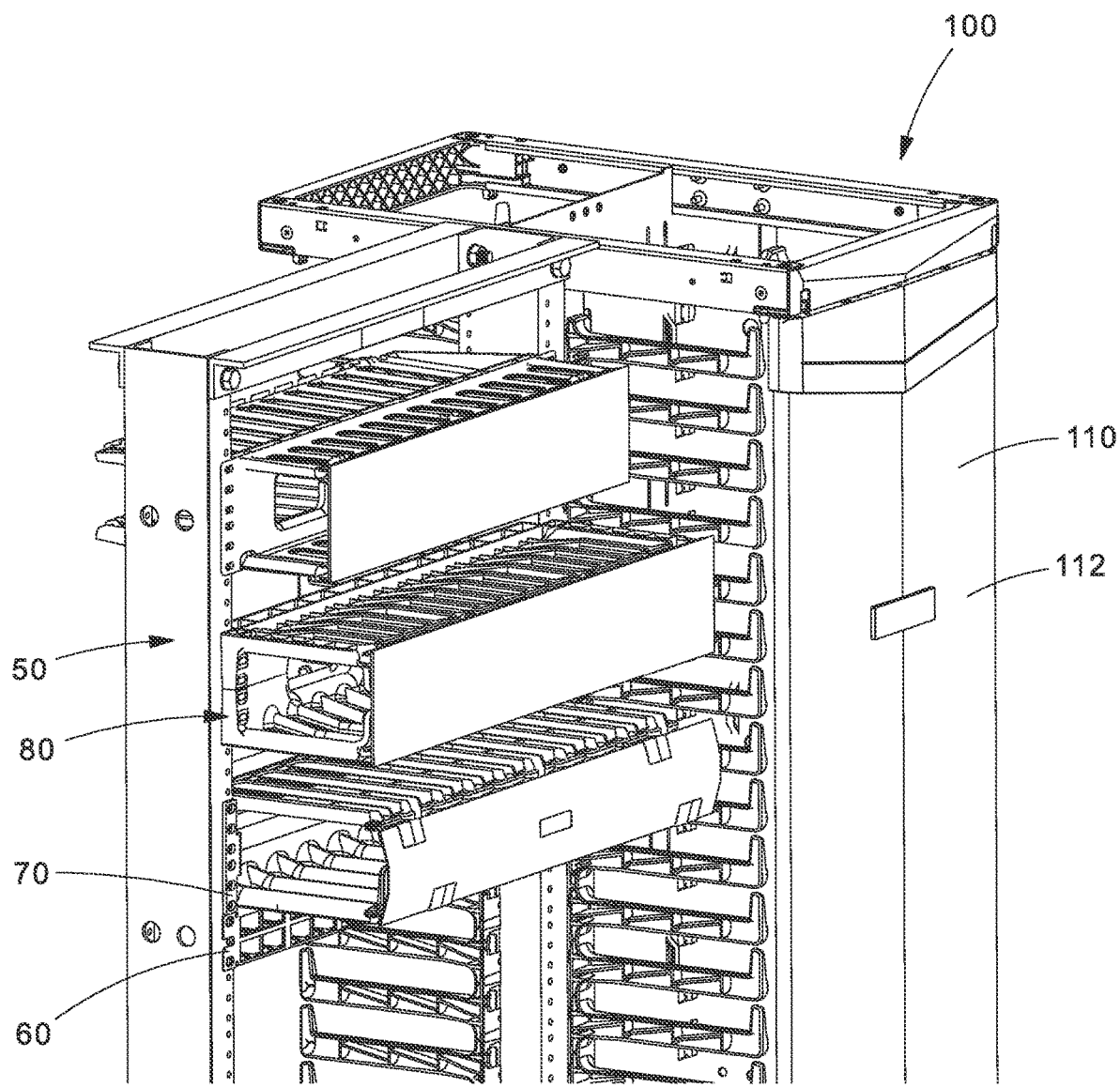
FIG. 1 is a perspective view of prior art horizontal cable managers mounted to a rack positioned adjacent to a vertical cable manager.
Figure 2:
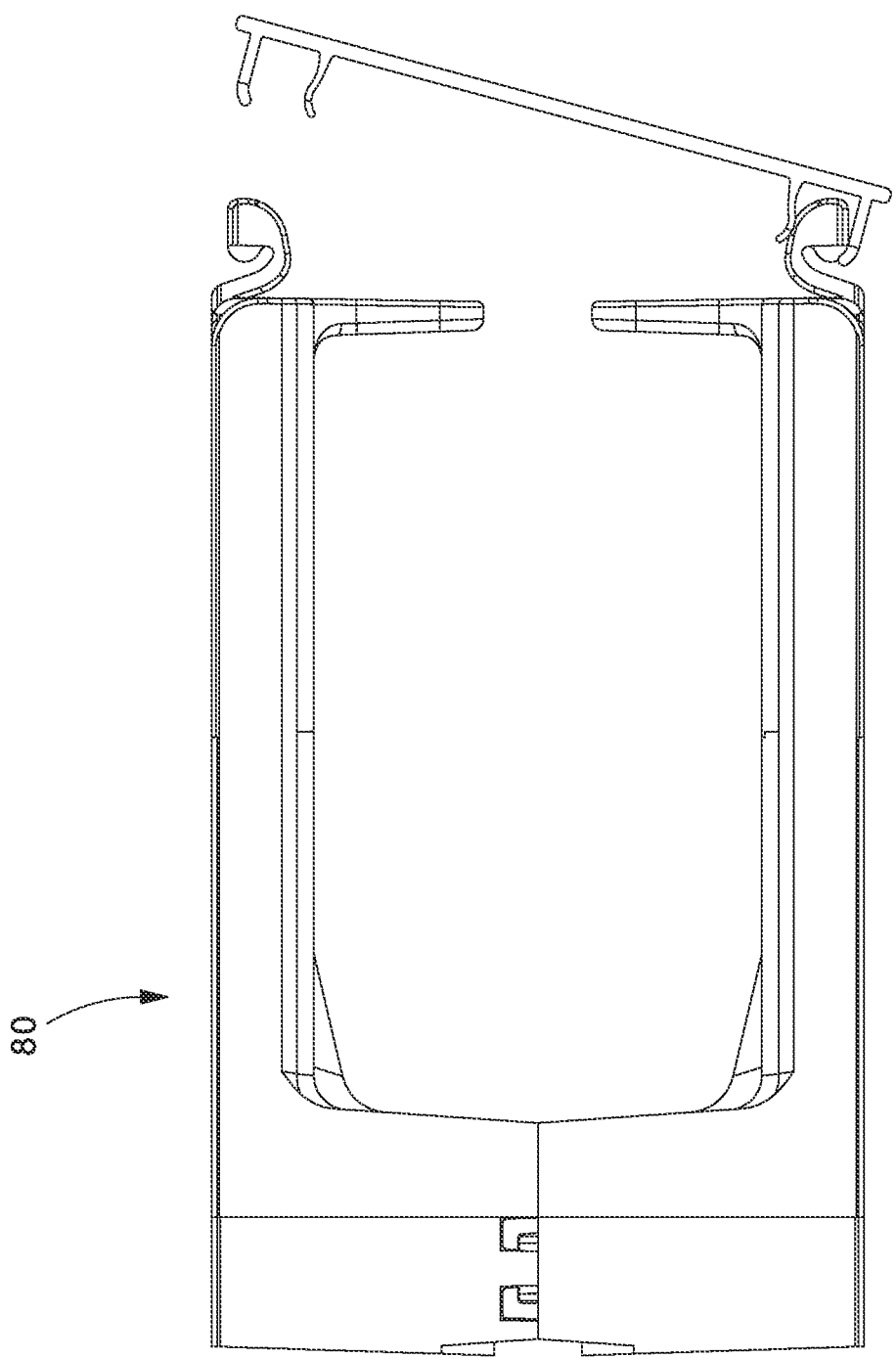
FIG. 2 is a left side view of the horizontal cable manager of FIG. 1.
Figure 3:
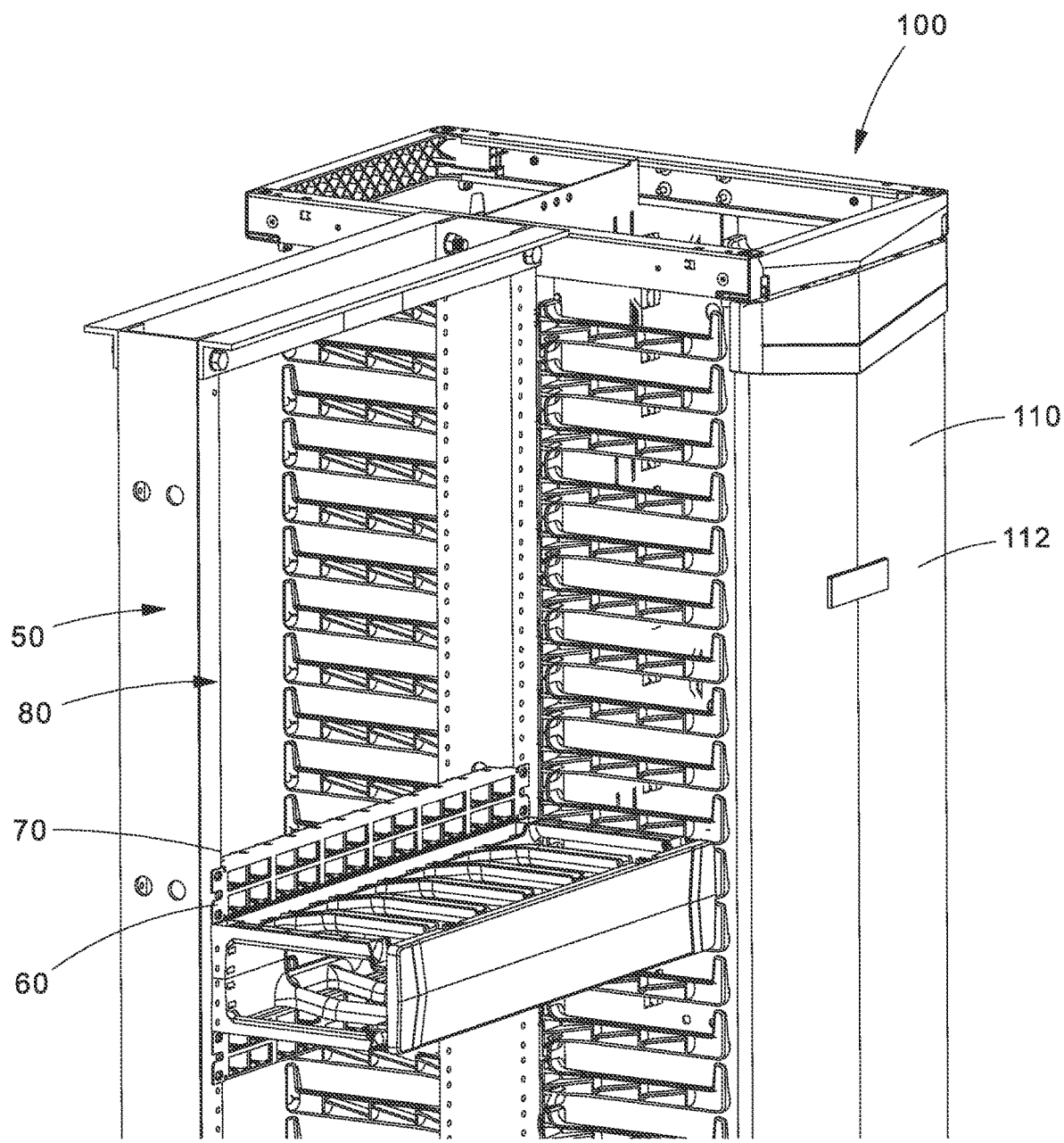
FIG. 3 is a perspective view of the horizontal cable manager of the present invention mounted to a rack positioned adjacent to a vertical cable manager.
Figure 4:
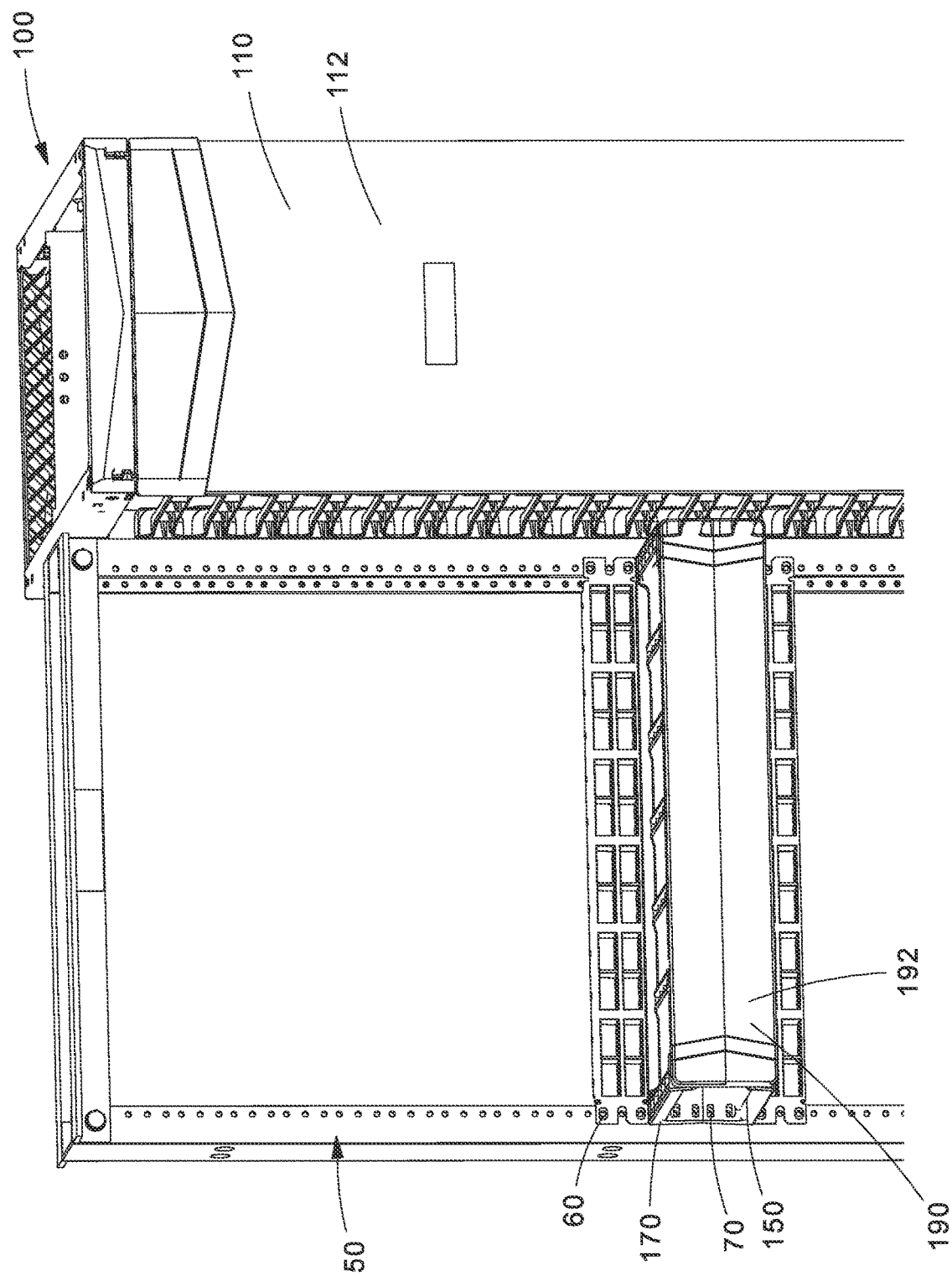
FIG. 4 is a front perspective view of the horizontal cable manager of FIG. 3 mounted to a rack positioned adjacent to a vertical cable manager.
Figure 5:
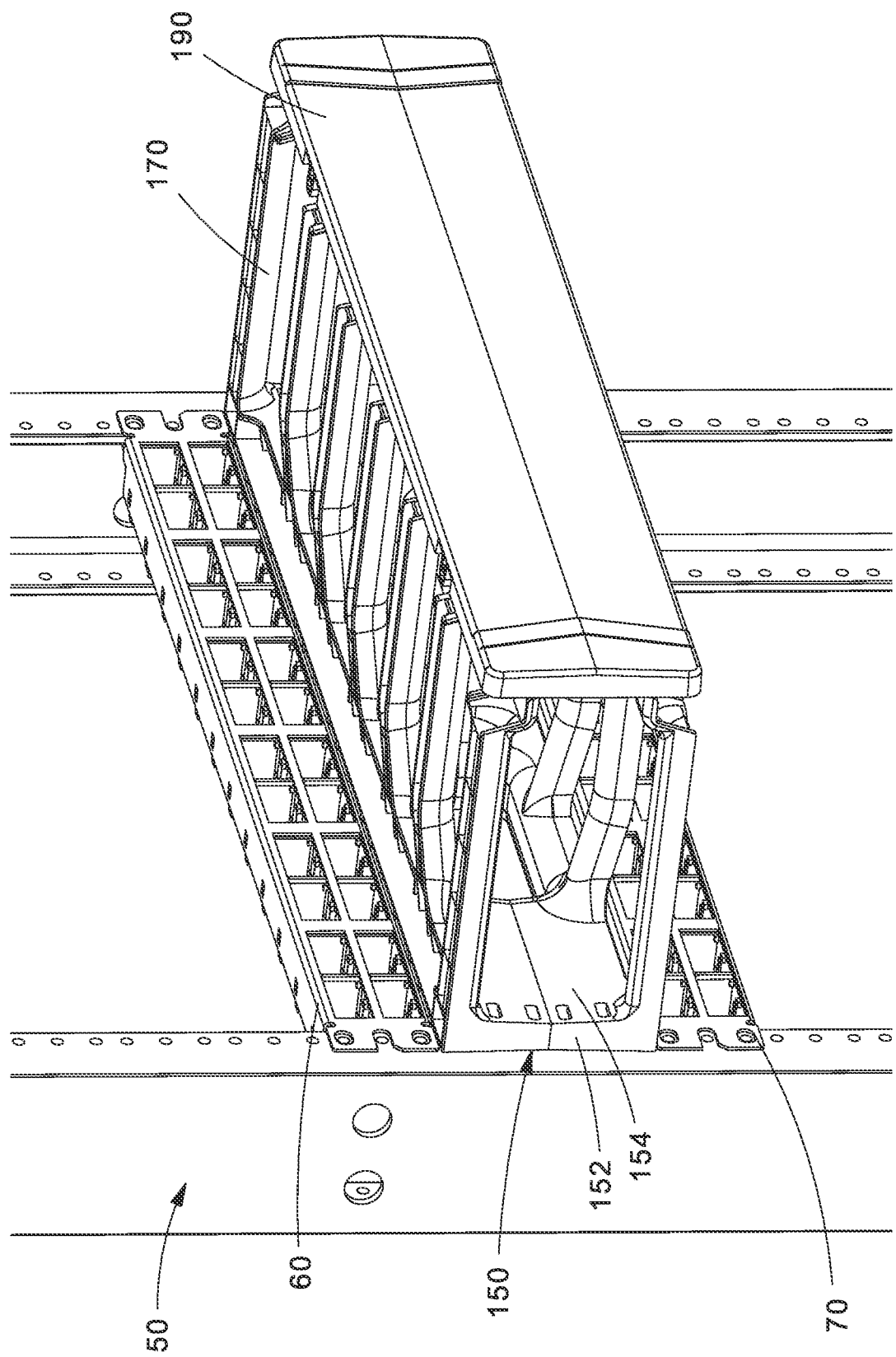
FIG. 5 is a front perspective view of the horizontal cable manager of FIG. 3 mounted to the rack.

FIGS. 3-5 illustrate the horizontal cable manager 150 of the present invention mounted to a standard 19" wide network rack 50. As described below, the horizontal cable manager 150 includes longer finger projections. The length of the fingers places the front surface 192 of the door 190 near the front of an adjoining vertical cable manager 100. For example, as illustrated in FIGS. 3 and 4, the front surface 192 of the door 190 of the present invention is near the front surface 112 of the door 110 of the vertical cable manager 100. As a result, the overall aesthetics of the horizontal cable manager 150 mounted adjacent to the vertical cable manager 100 have improved.

Figure 6:
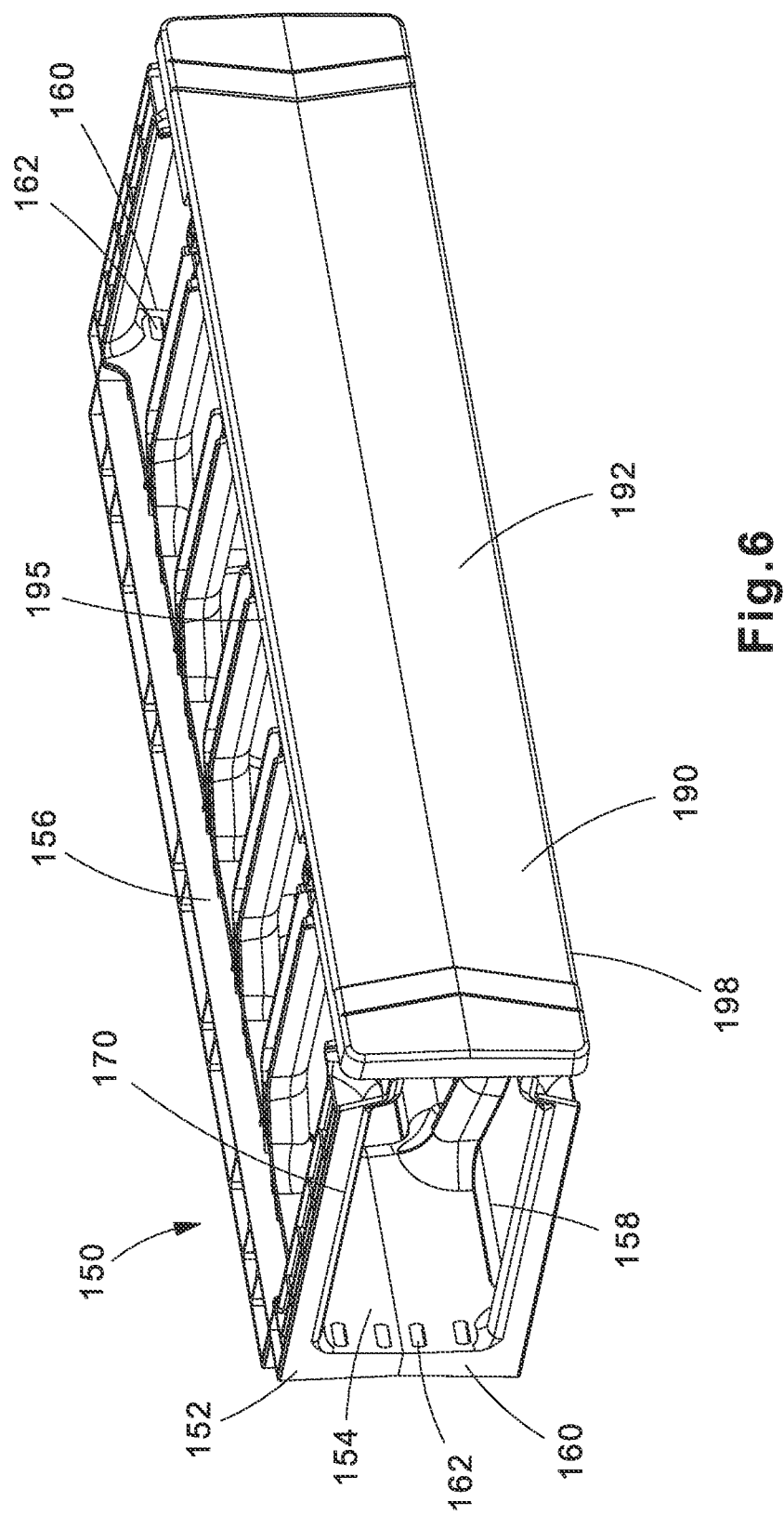
FIG. 6 is a front perspective view of the horizontal cable manager of FIG. 3.

As illustrated in FIGS. 5 and 6, the horizontal cable manager 150 includes a body 152 and a door 190. The body 152 includes a back 154 with a plurality of fingers 170 extending therefrom. The length of the fingers 170 has been extended compared to the fingers of the prior art horizontal cable manager 80. The fingers 170 are arranged in an upper row extending from the upper portion 156 of the back 154 and a lower row extending from the lower portion 158 of the back 154. The upper and lower rows of the fingers 170 are parallel to each other and create a pathway for routing cables therein. The fingers 170 are angled toward the vertical center of the body 152 to provide a technician access to any equipment 60 installed above or below the horizontal cable manager 150.

Each end 160 of the back 154 includes a plurality of holes 162 for receiving fasteners 70 to secure the body 152 of the horizontal cable manager 150 to the network rack 50.

Figure 7:
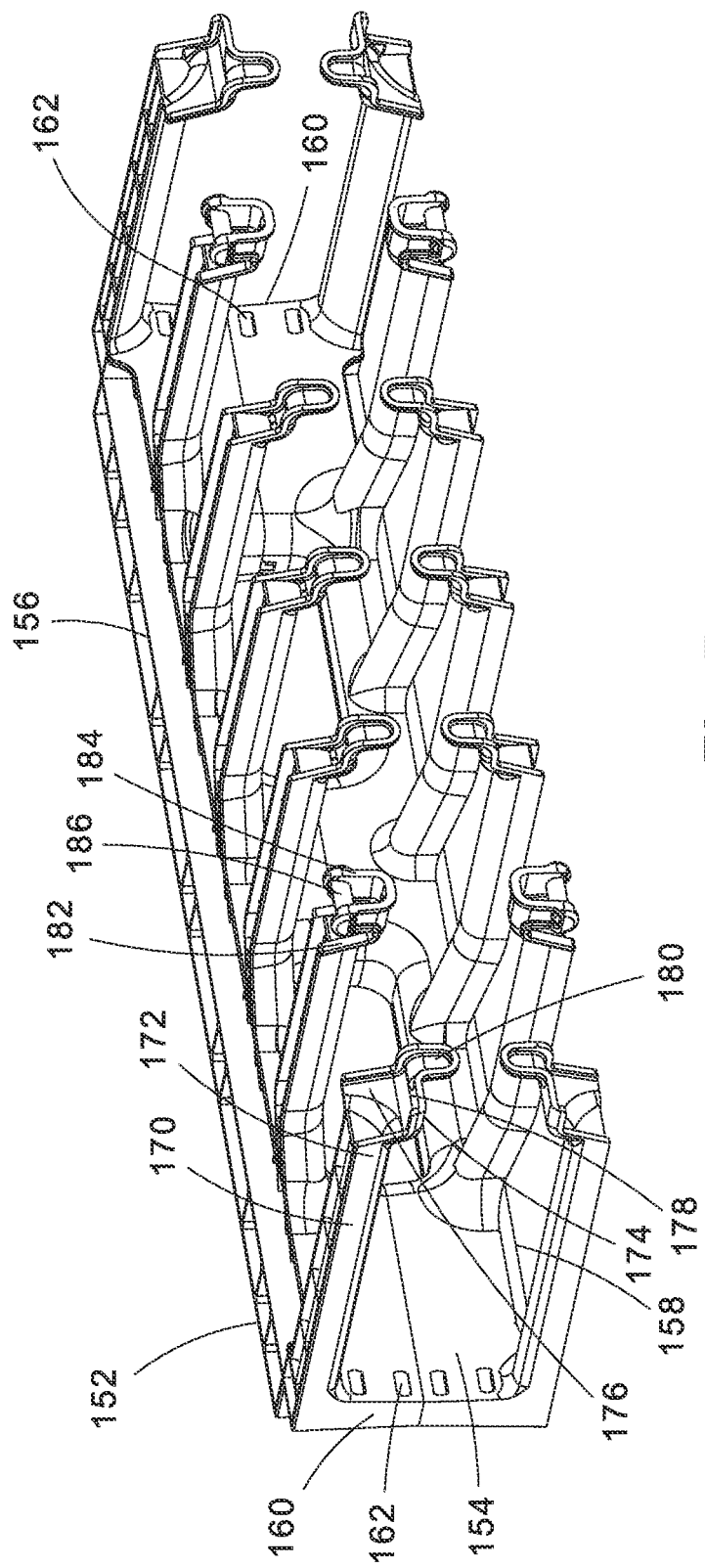
FIG. 7 is a front perspective view of the horizontal cable manager of FIG. 6 with the hinge door removed.
Figure 8:
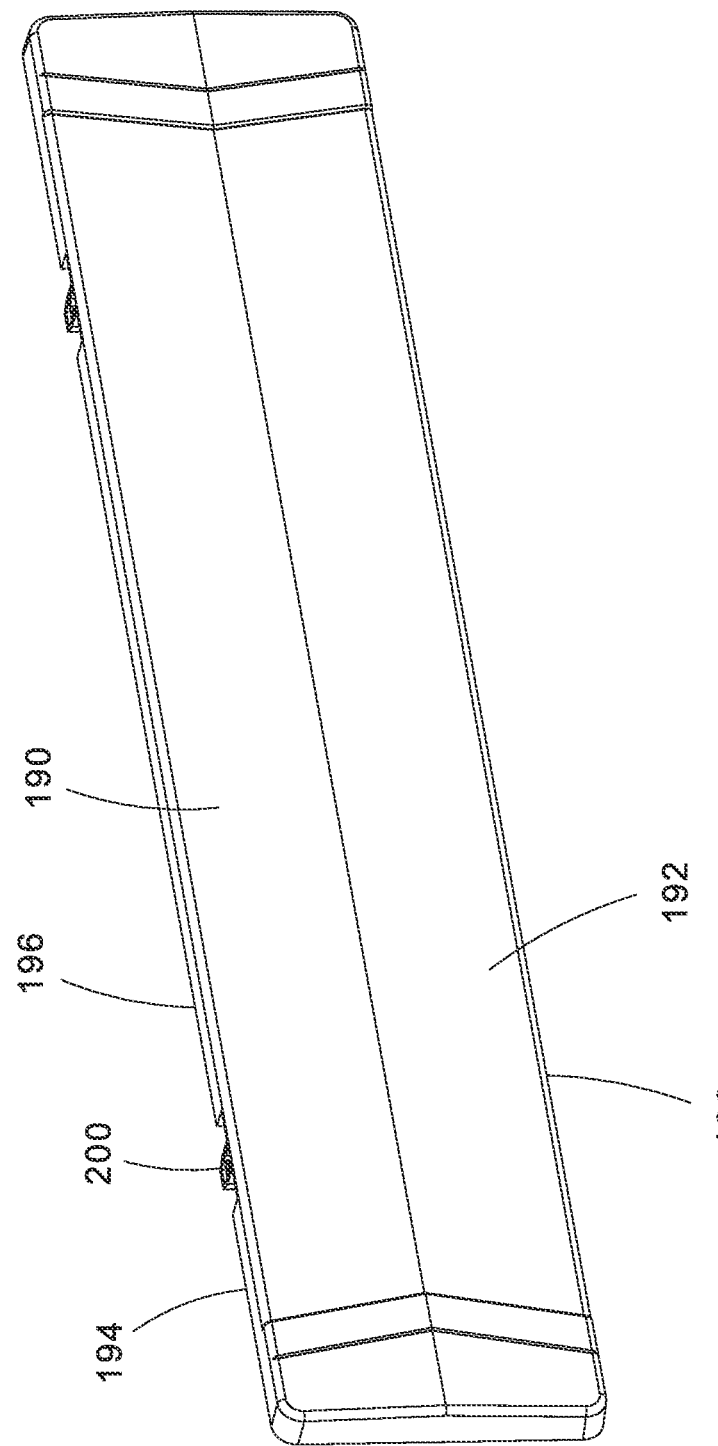
FIG. 8 is a front perspective view of the horizontal cable manager hinge door of FIG. 6.
Figure 9:
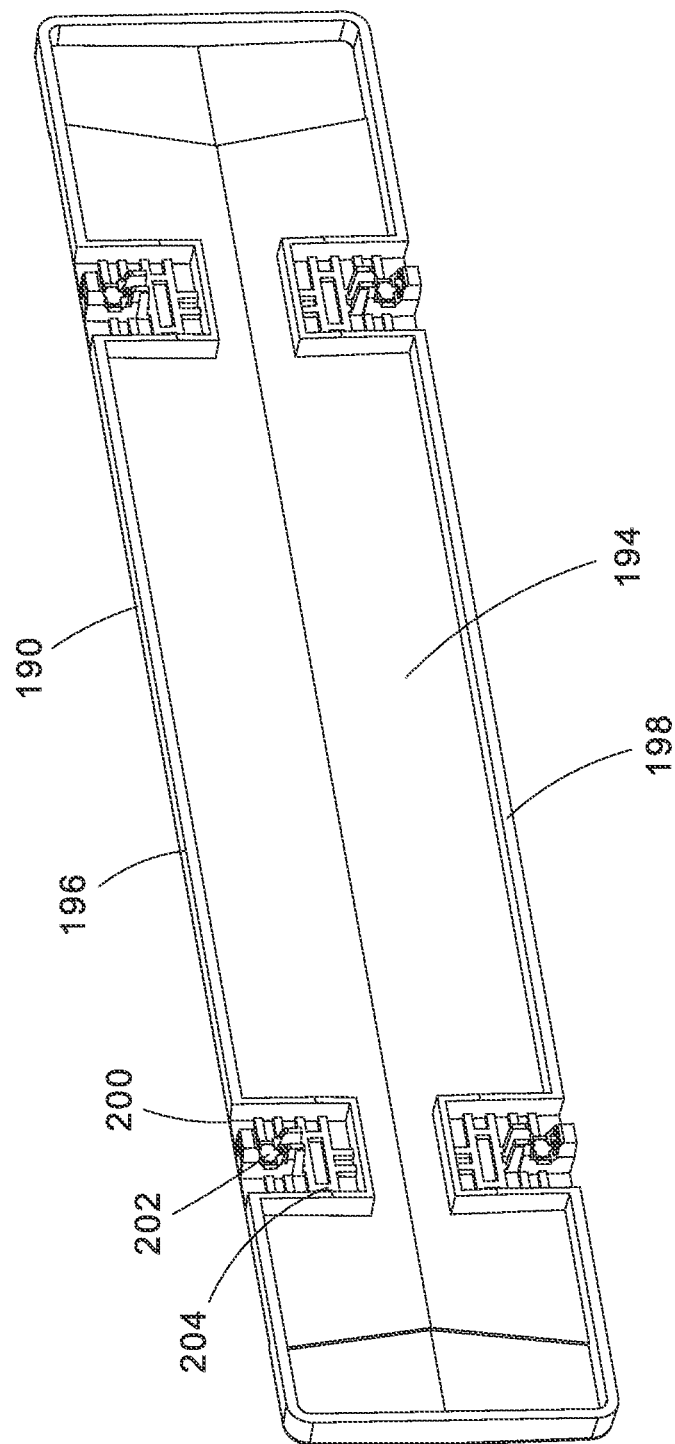
FIG. 9 is a rear perspective view of the horizontal cable manager hinge door of FIG. 8.
Figure 10:
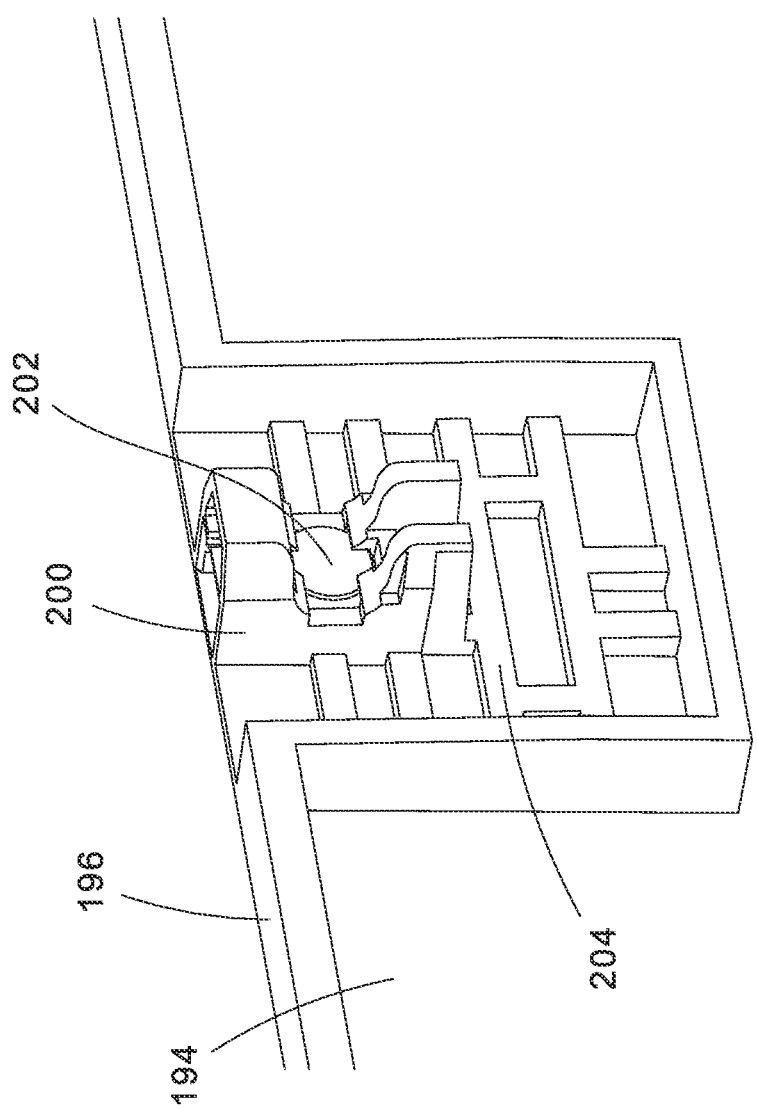
FIG. 10 is a perspective view of the hinge receptacle of the horizontal cable manager hinge door of FIG. 9.
Figure 11:
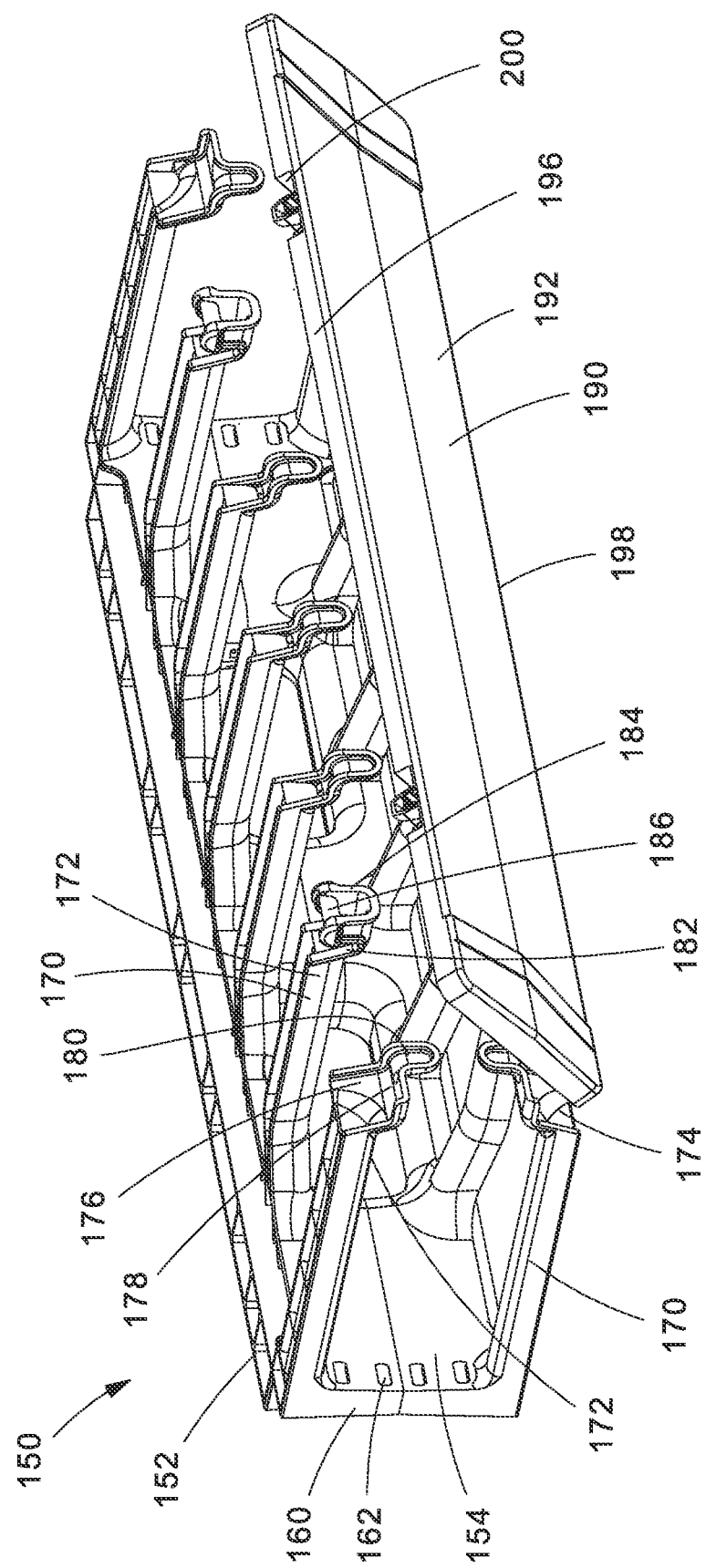
FIG. 11 is a perspective view of the horizontal cable manager of FIG. 6 with the hinge door partially rotated.

The distal end 172 of each finger 170 has either a cable management flag 174 or a hinge pin holder 182. Each cable management flag 174 includes a first member 176, a second member 178, and a third member 180. Each member of the cable management flags can differ in size, length, and shape depending on the location of the finger and the height of the horizontal cable manager. For example, as illustrated in FIG. 7, the cable management flags 174 located near the ends 160 of the body 152 are wider than the cable management flags 174 located near the center of the body 152. The cable management flags 174 extending from aligned fingers 170 in the upper and lower rows are identical.

As illustrated in FIG. 7, the distal end 172 of the aligned fingers 170 in the upper and lower rows include two sets of hinge pin holders 182. However, if desired, the distal end 172 of the fingers 170 could have additional hinge pin holders. The hinge pin holders 182 are generally U-shaped members 184 designed to hold a ferrous hinge pin 186. As discussed below, the hinge pin holder 182 accepts one of the hinge receptacles 200 extending from the back 194 of the door 190.

FIGS. 8-11 illustrate the door 190 of the horizontal cable manager 150. The front 192 of the door 190 includes design elements similar to the design features found on the Panduit Patchrunner 2 vertical cable manager door. For example, the door 190 includes a pentagon with two right angles and chevron character lines.

The back 194 of the door 190 includes a plurality of hinge receptacles 200. The hinge receptacles 200 are positioned along the top edge 196 and the bottom edge 198 of the door 190. Each hinge receptacle 200 includes a rare earth magnet 202 which allows the door 190 to attach to the ferrous hinge pins 186 held by the hinge pin holders 182 at the distal end 172 of the fingers 170 of the body 152. Each hinge receptacle 200 also includes a plurality of strengthening ribs 204.

The rare earth magnets 202 and the ferrous hinge pin 186 form a magnetic hinging mechanism that allows for an effortless attachment of the door 190 to the cable manager body 152. The magnetic hinging mechanism also allows for the door 190 to easily open with a mild pulling force on either the top or bottom edge 196, 198, respectively, of the door 190.

Figure 12:
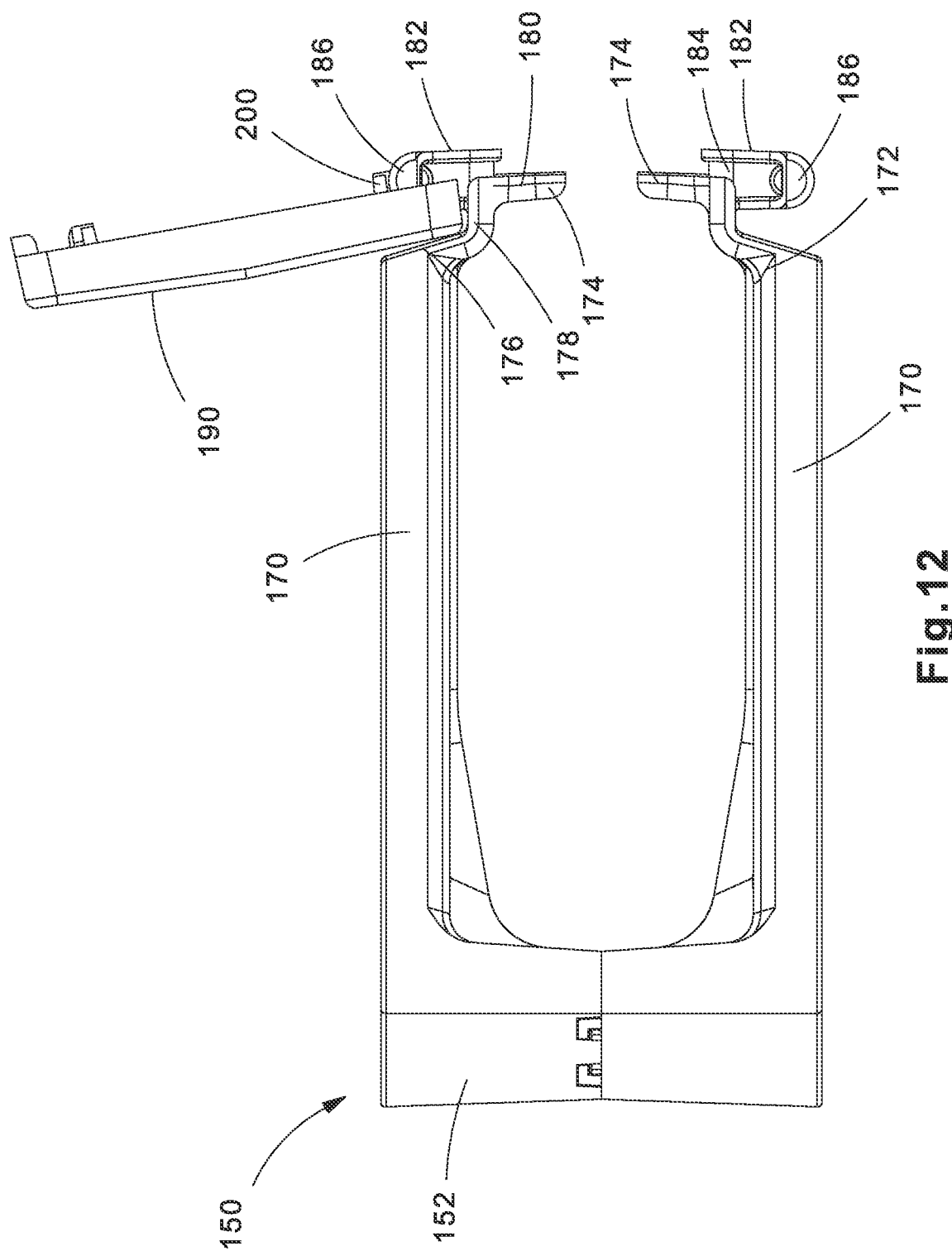
FIG. 12 is a left side view of the horizontal cable manager of FIG. 6 with the hinge door opened and rotated around the upper hinge.
Figure 13:
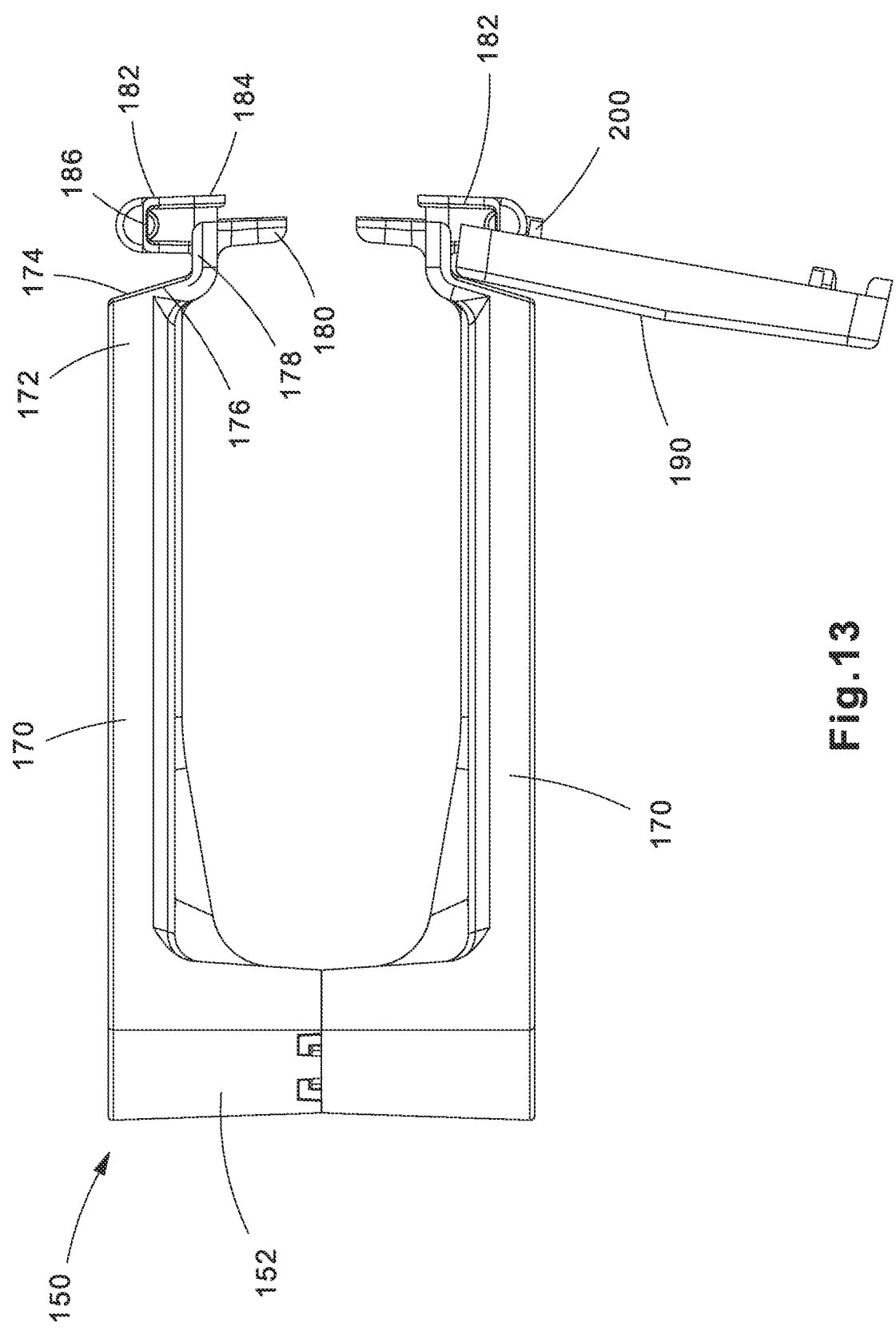
FIG. 13 is a left side view of the horizontal cable manager of FIG. 6 with the hinge door opened and rotated around a lower hinge.

The hinge receptacle 200 and the hinge pin holder 182 are oriented in such a way as to allow the door 190 to be opened and rotated up to 190 degrees around the upper hinge pins 186 (see FIG. 12) or rotated up to 190 degrees around the lower hinge pins 186 (see FIG. 13). When the door 190 is opened upward around the upper hinge pins 186 past 180 degrees, the door 190 will rest in an open position against the first members 176 of the cable management flags 174 to facilitate access to the cables routed inside the cable manager body 152. When the door 190 is opened downward around the lower hinge pins 186, it can be allowed to hang downward at 180 degrees to facilitate access to cables inside the cable manager body 152.

The door 190 can also be completely removed from the cable manager body 152, if desired, by pulling on the door 190 horizontally away from the cable manager body 152.

Figure 14:
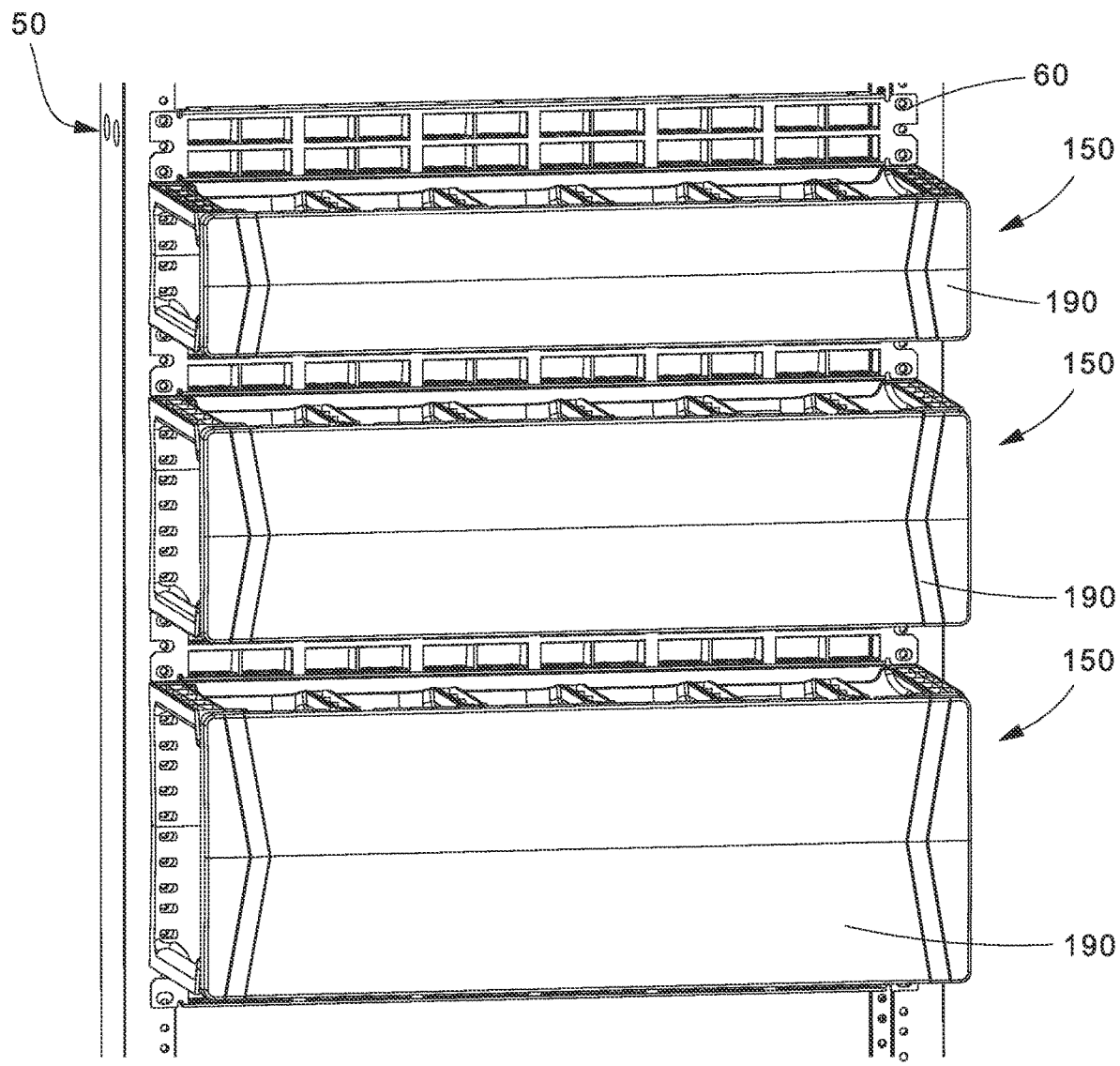
FIG. 14 is a front perspective view of multiple horizontal cable managers having varying heights mounted to a rack.

FIG. 14 illustrates the horizontal cable manager 150 and the hinged door 190 of the present invention having varying heights. For example, the horizontal cable manager 150 can be designed so it is 2 rack units (2RU), 3 rack units (3RU), or 4 rack units (4 RU) high. The height of the hinged door 190 is adjusted to accommodate the heights of the various horizontal cable managers 150.

Figure 15:
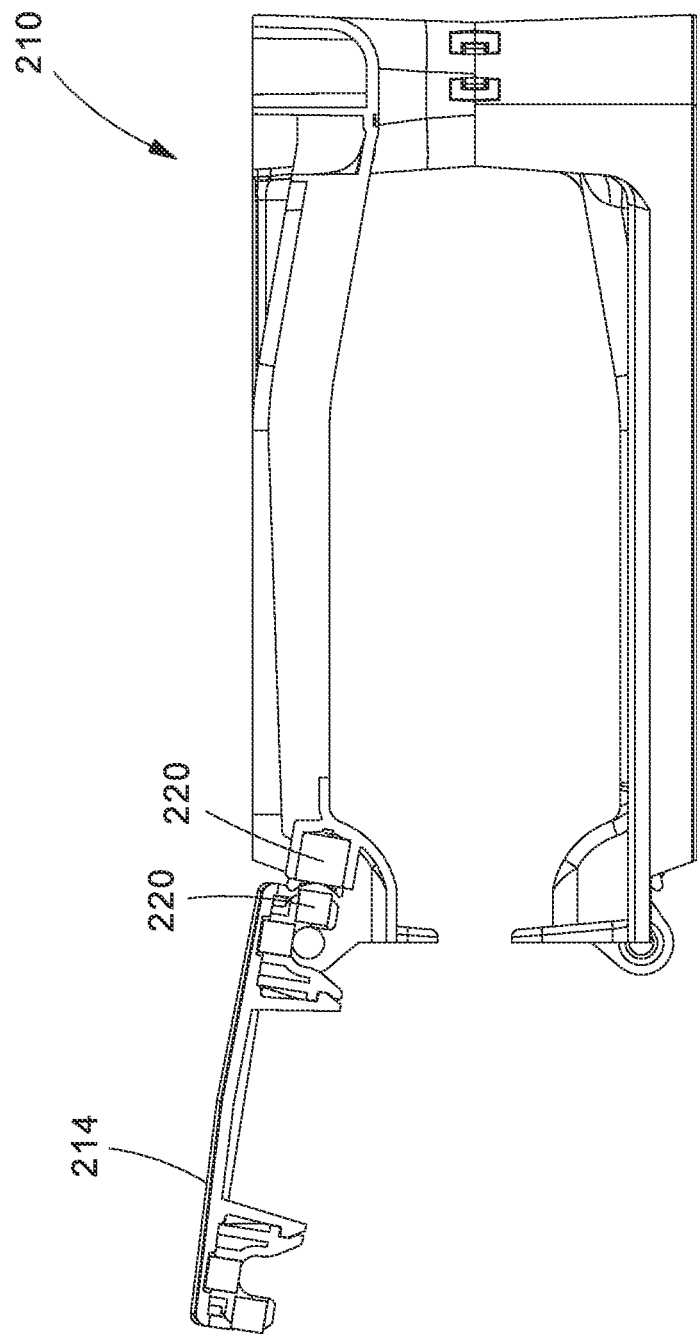
FIG. 15 is side view of an alternative horizontal cable manager of the present invention.

FIG. 15 illustrates an alternative horizontal cable manager 210 embodiment. The horizontal cable manager 210 includes additional magnets 220 at each hinge location. The additional magnets 220 hold the door 214 in an open position by toggling the door 214 into a hold open detent position when the door 214 reaches the fully open position of about 110 degrees from closed. The hold open detent is easily defeated by applying a force to close the door 214.

Figure 16:
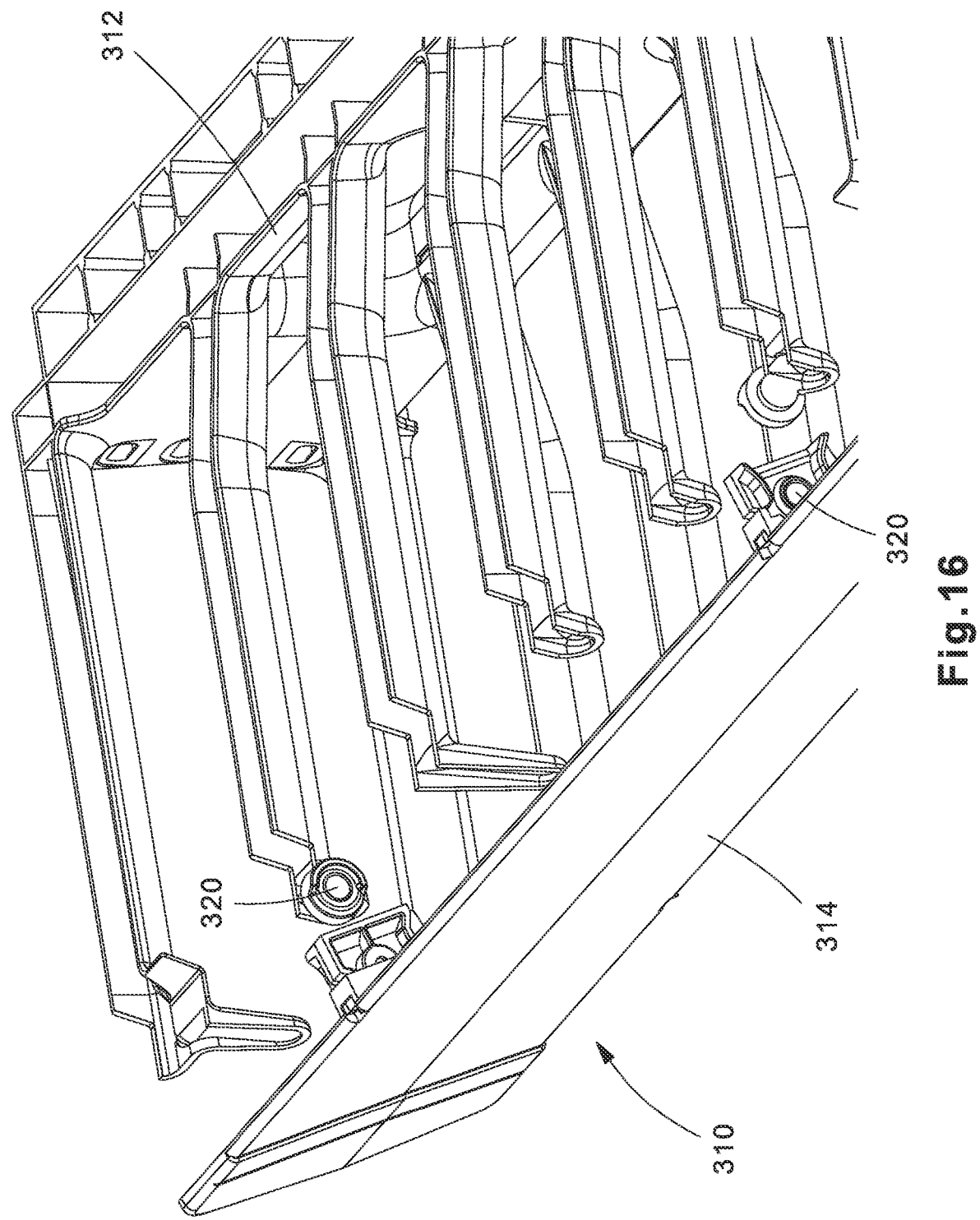
FIG. 16 is a top right perspective view of an alternative horizontal cable manager of the present invention.
Figure 17:
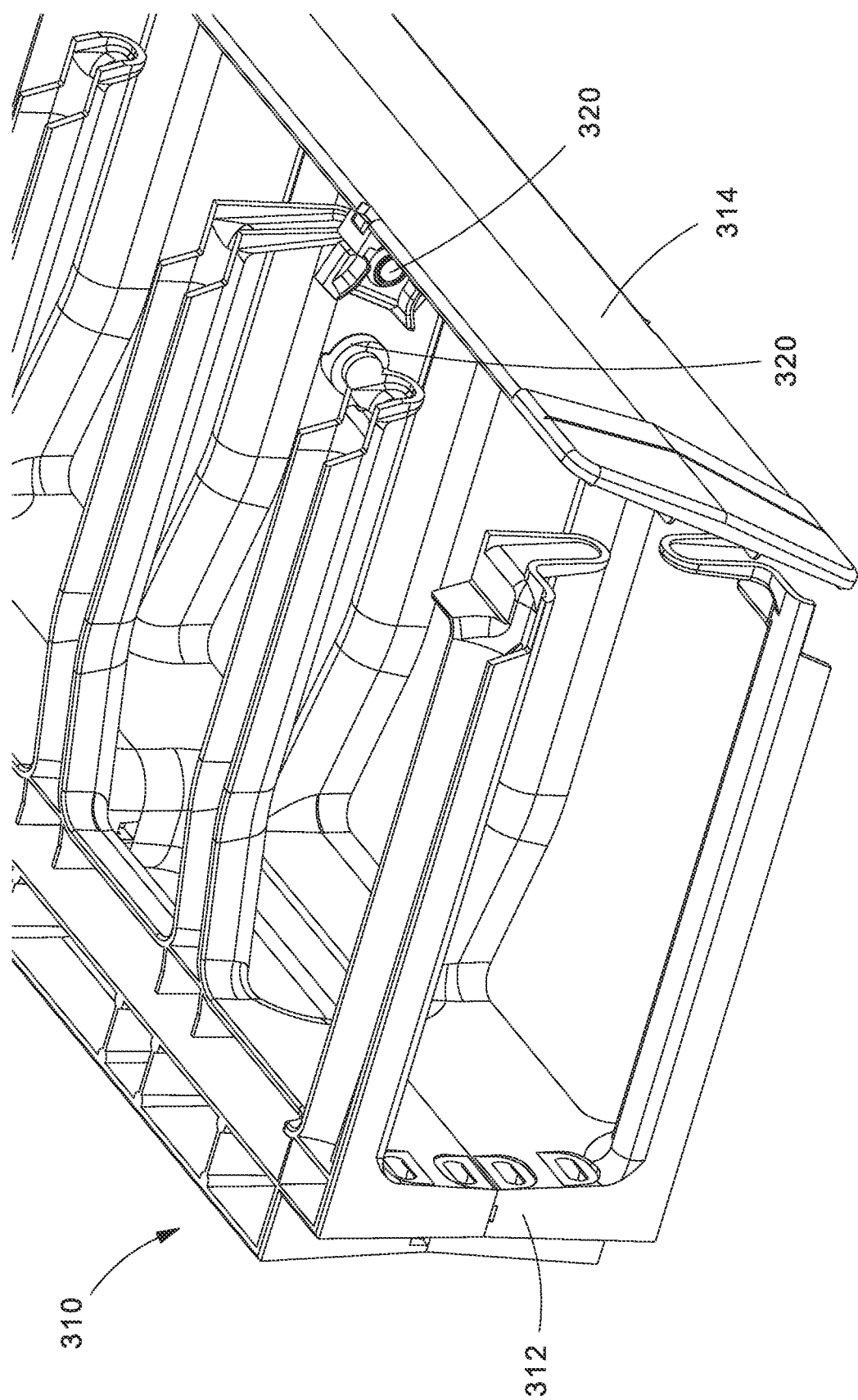
FIG. 17 is a top left perspective view of the alternative horizontal cable manager of FIG. 16.

Another alternative embodiment is illustrated in FIGS. 16 and 17. The magnets 320 are installed in the door 314 and the cable manager body 312 in such a way that the axis of the magnetic force forms the hinge axis for the door 314. The door 314 is opened by defeating the shear magnetic attraction on the opening side and rotating the door 314 along the hinge axis formed by either the upper magnets 320 or the lower magnets 320.

The door could also include a number of stiffening ribs as dictated by the door size, the necessary flexibility, and molding warp.

Figure 18:
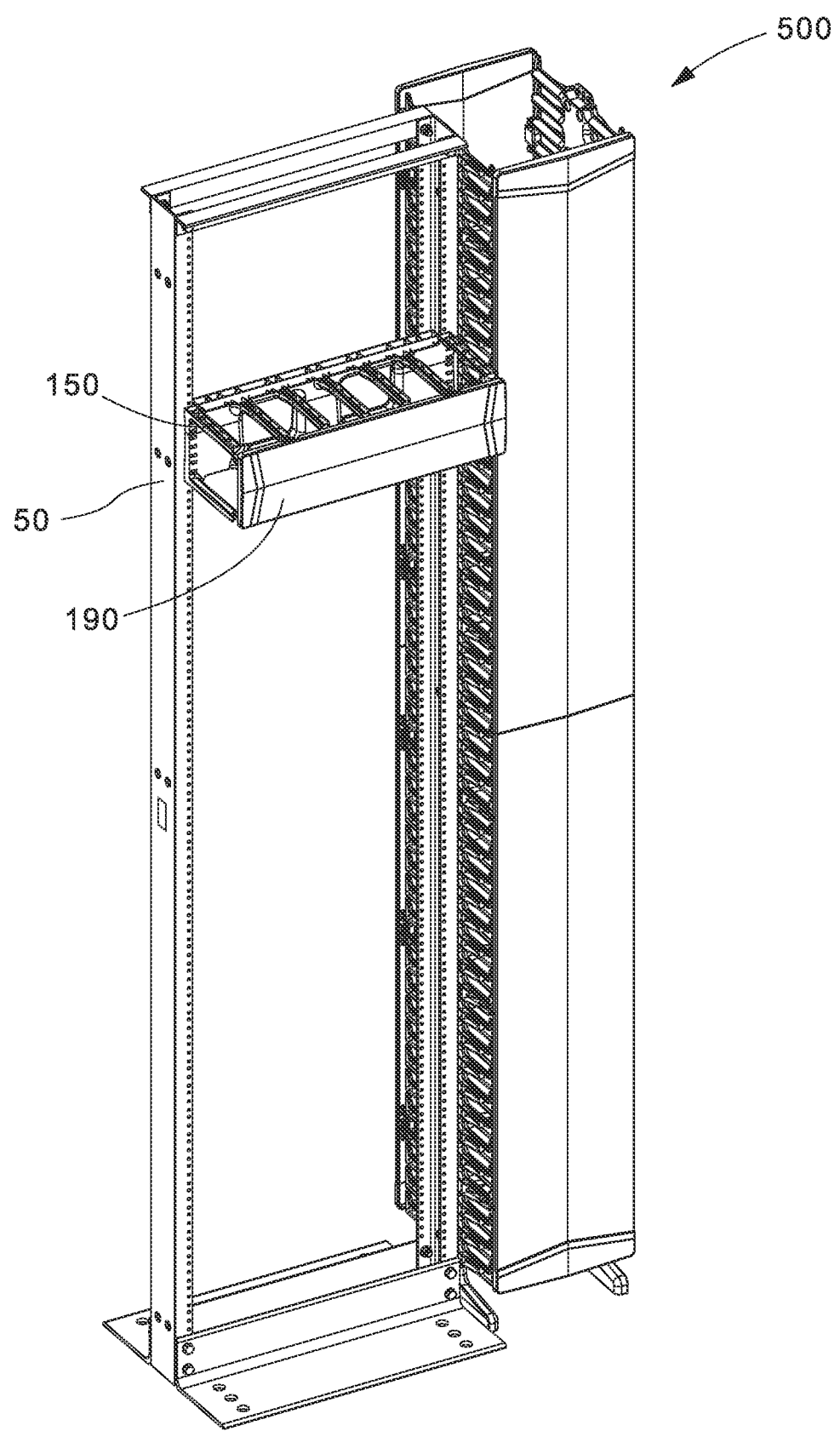
FIG. 18 is a perspective view of the horizontal cable manager of FIG. 3 mounted to a rack positioned adjacent to a vertical cable manager.
Figure 19:
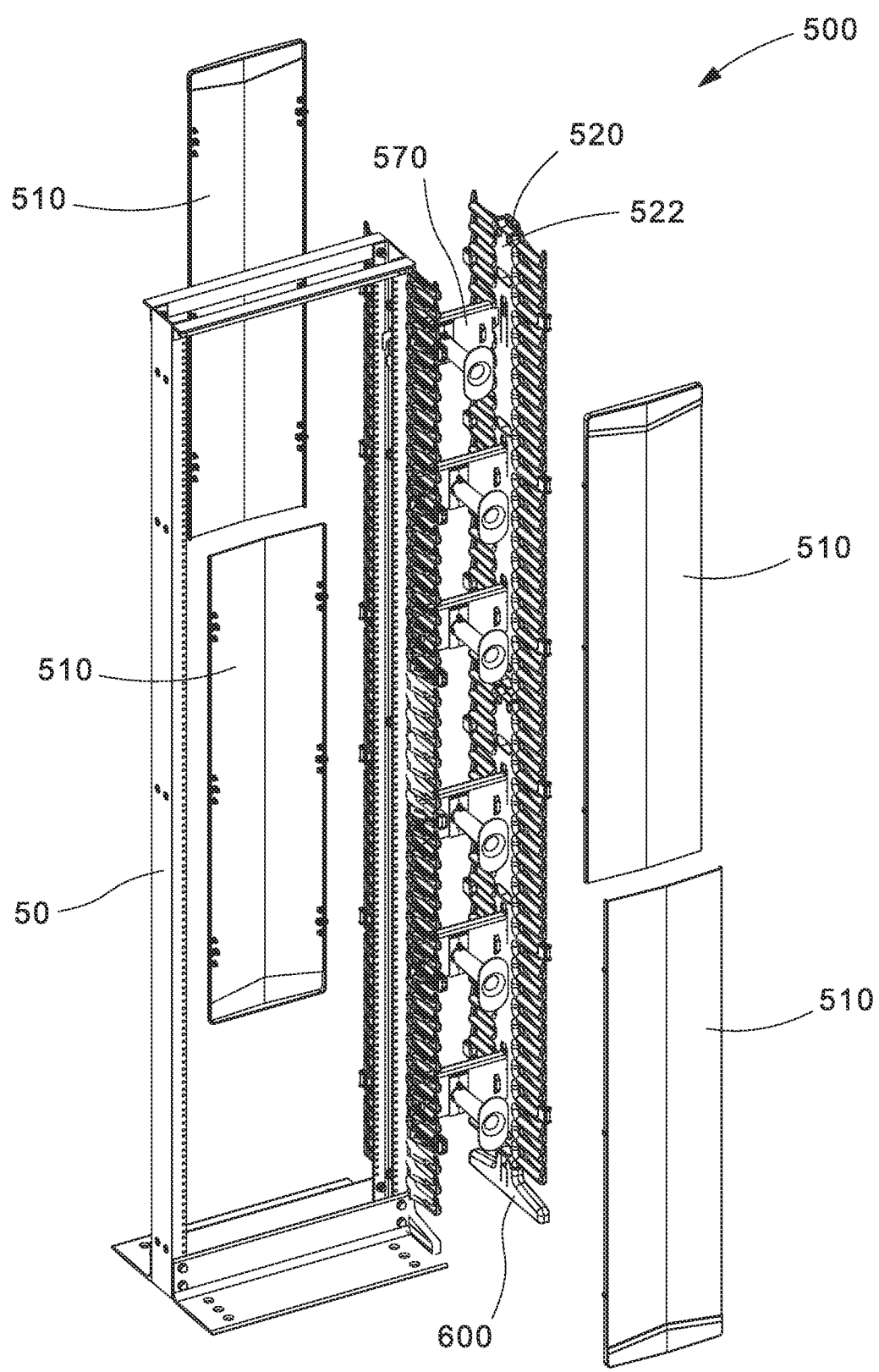
FIG. 19 is a perspective partially exploded view of the rack and vertical cable manager of FIG. 18.
Figure 20:
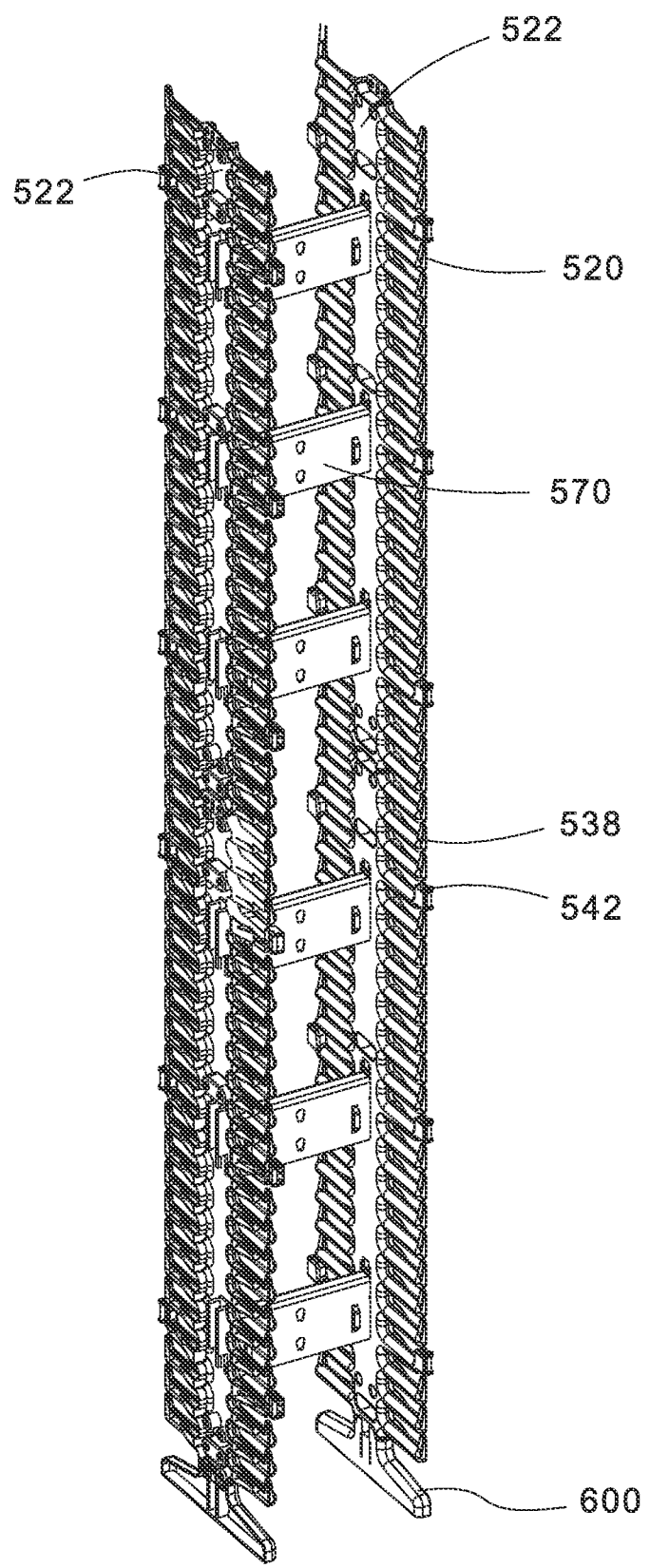
FIG. 20 is a perspective view of the vertical cable manager of FIG. 19 without the doors.
Figure 21:
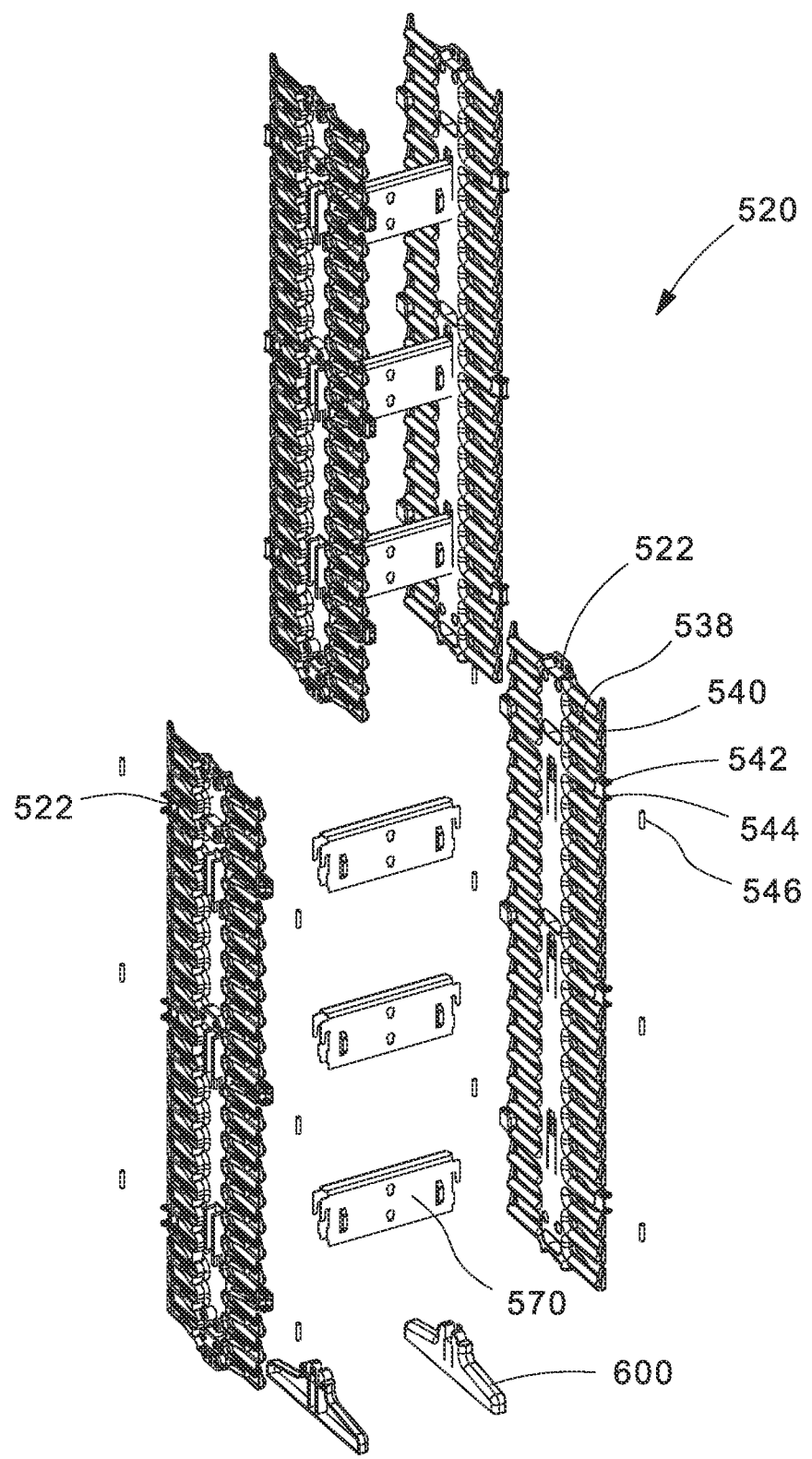
FIG. 21 is a partially exploded view of the vertical cable manager of FIG. 20.

FIG. 18 illustrates a horizontal cable manager 150 and a vertical cable manager 500 of the present invention mounted to a network rack 50. FIG. 19 illustrates a partially exploded view of the vertical cable manager 500 mounted to the network rack 50 with the doors 510 removed. The doors 510 will be described below with respect to FIGS. 27-30.

FIGS. 20-26 illustrate the vertical cable manager 500 without the doors 510 installed. The vertical cable manager 500 is formed from finger assemblies 520, cross members 570, and stabilizing bases 600. A stabilizing base 600 is attached to the bottom of each parallel finger assemblies 520 which allows the vertical cable manager 500 to be free standing. This enables easier set up and installation of the vertical cable manager 500.

Figure 22:
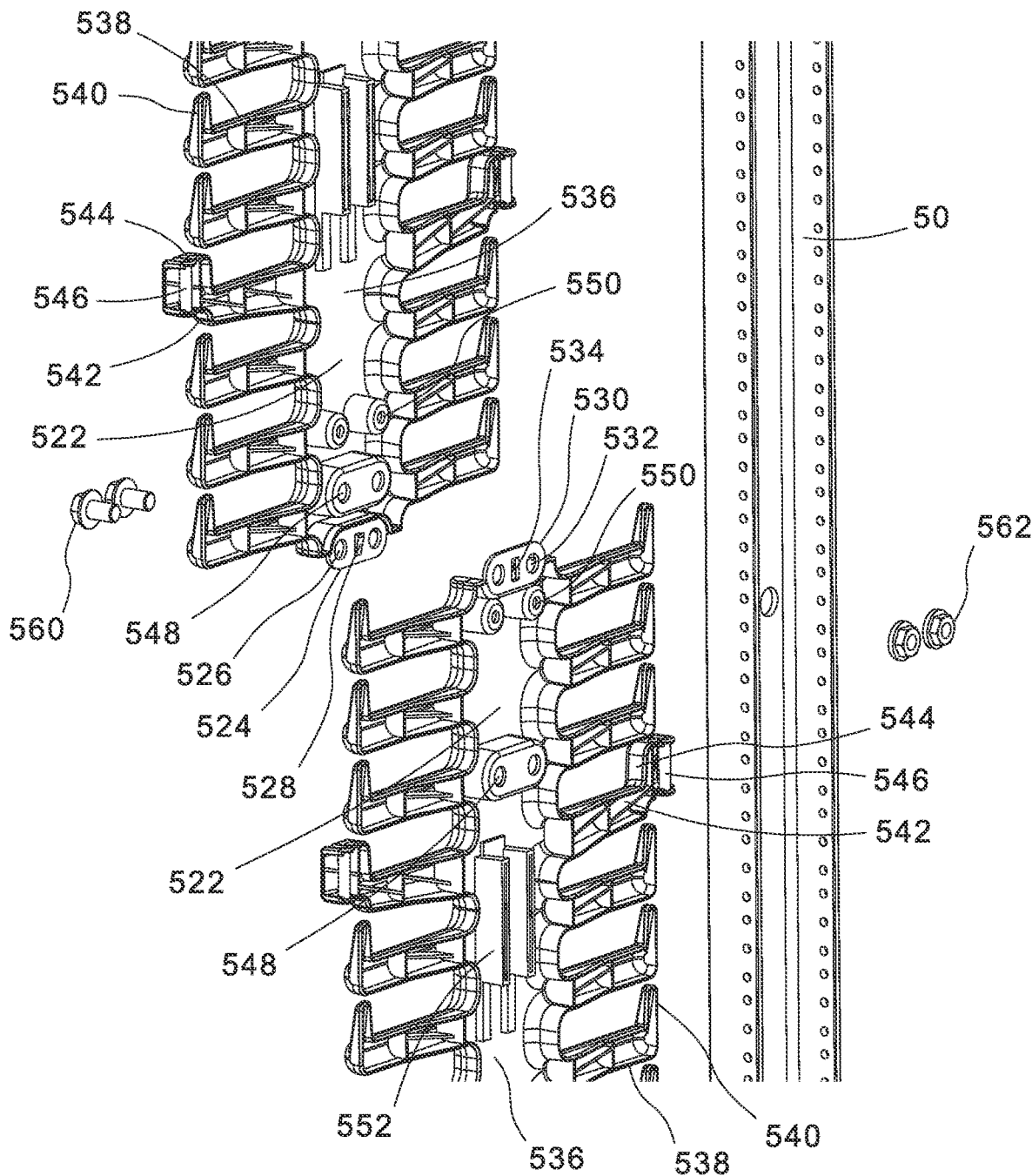
FIG. 22 is an exploded view of the finger assembly of the vertical cable manager and the rack of FIG. 19.

The finger assemblies 520 include two injection molded finger segments 522 that are vertically joined together. Each injection molded finger segment 522 includes a lower vertical connection 524 and an upper vertical connection 530. As illustrated in FIG. 22, the lower vertical connection 524 includes two rack mounting holes 526 and a snap 528 positioned between the rack mounting holes 526. The upper vertical connection 530 includes two rack mounting holes 532 and a vertical joining receptacle 534. The finger segments 522 are joined together by the snap 528 and vertical joining receptacle 534. Mounting bolts 560 pass through the rack mounting holes 526 in the lower vertical connection 524 and the upper vertical connection 530 and are secured by mounting nuts 562. The mounting bolts 560 may also pass-through holes 52 in a network rack 50 to secure the finger segments 522 to the network rack 50.

Figure 23:
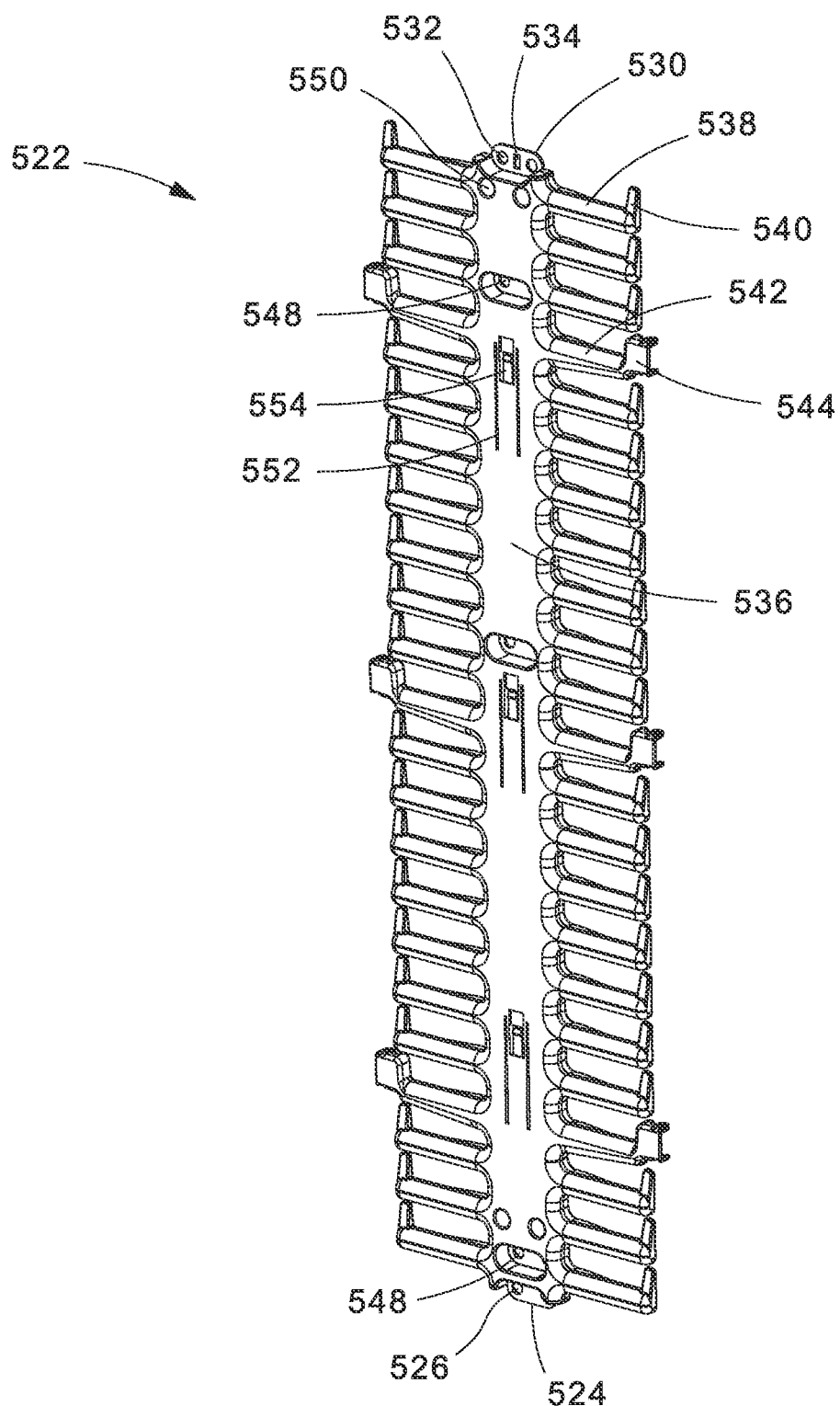
FIG. 23 is a perspective view of the inside of a finger segment of the vertical cable manager of FIG. 19.
Figure 24:
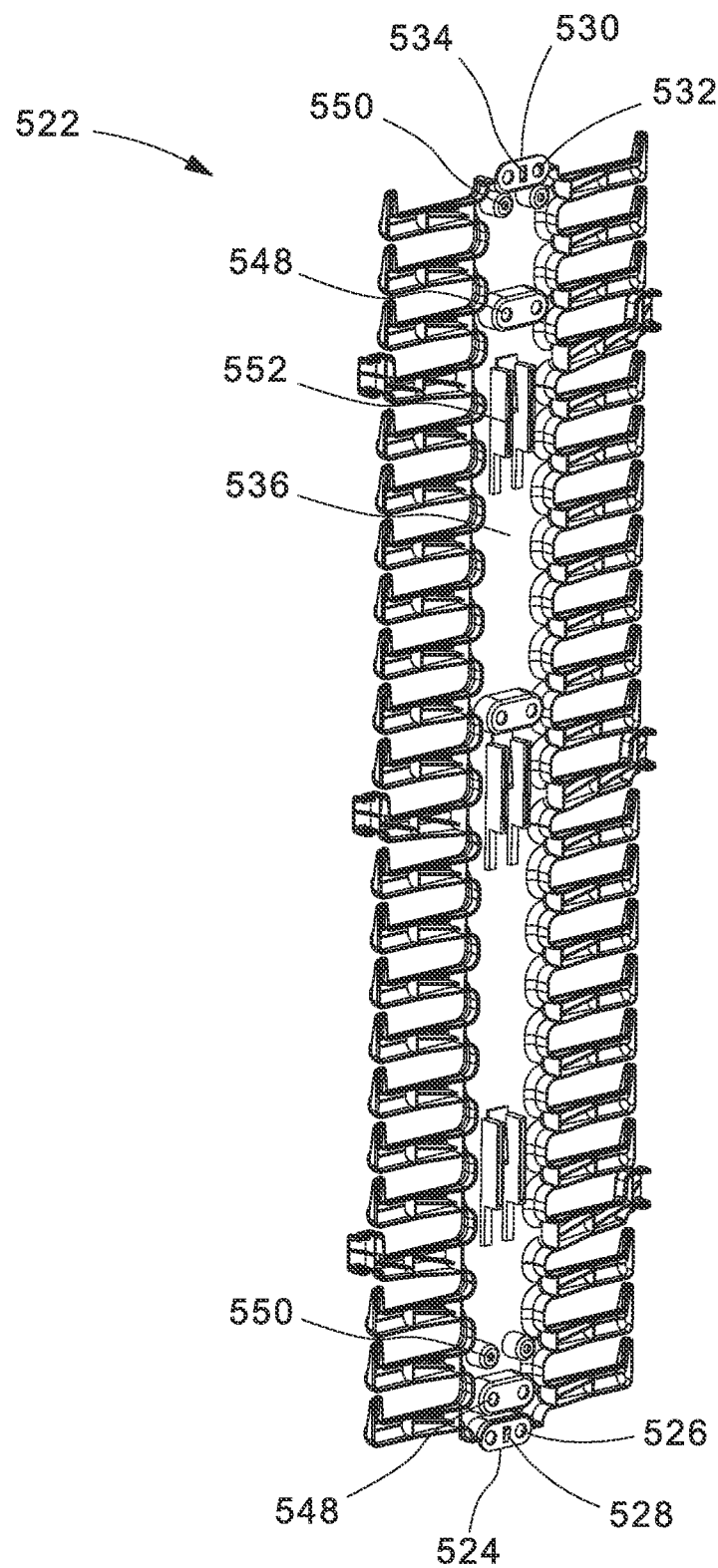
FIG. 24 is a perspective view of the outside of a finger segment of the vertical cable manager of FIG. 19.

FIG. 23 is an inside view of a finger segment 522 and FIG. 24 is an outside view of a finger segment 522. The finger segment 522 includes a center spine 536 with fingers 538 and hinge fingers 542 extending from the center spine 536. The fingers 538 and the hinge fingers 542 extend from both edges of the center spine 536. Alternatively, the finger segment 522 may have a configuration where the fingers 538 and the hinge fingers 542 project from only one edge and only extend forward.

The fingers 538 have an upturned flag 540 at the end to effectively contain cables between adjacent fingers 538. Hinge fingers 542 have a hinge flag or holder 544 at the end which serves to hold a metallic hinge pin 546 for interacting with the door 510 that covers the vertical cable manager 500.

The center spine 536 includes additional rack mounting holes 548 and accessory mounting holes 550 at various positions along the center spine 536. The center spine 536 also includes cross member slots 552 and locking snaps 554 that receive the cross member 570.

The finger segments 522 are joined together laterally using cross members 570. The cross members 570 are illustrated in detail in FIGS. 25 and 26. Each cross member 570 attaches to the finger segment 522 via the geometry at the ends 572 of the cross member 570 and the cross-member slots 552 and the locking snaps 554 in the center spine 536. The cross member 570 includes connection tabs 574, stabilizing tabs 576, and locking tabs 578. Each connection tab 574 is angled so that the connection gets tighter as cross member 570 engagement in the cross-member slots 552 in the center spine 536 increases. The locking tabs 578 lock into the locking snaps 554 on the center spine 536 of the finger segments 522 and prevent disengagement of cross member 570 from the finger segment 522. The stabilizing tabs 576 prevent tilting rotation of the cross member 570.

Figure 25:
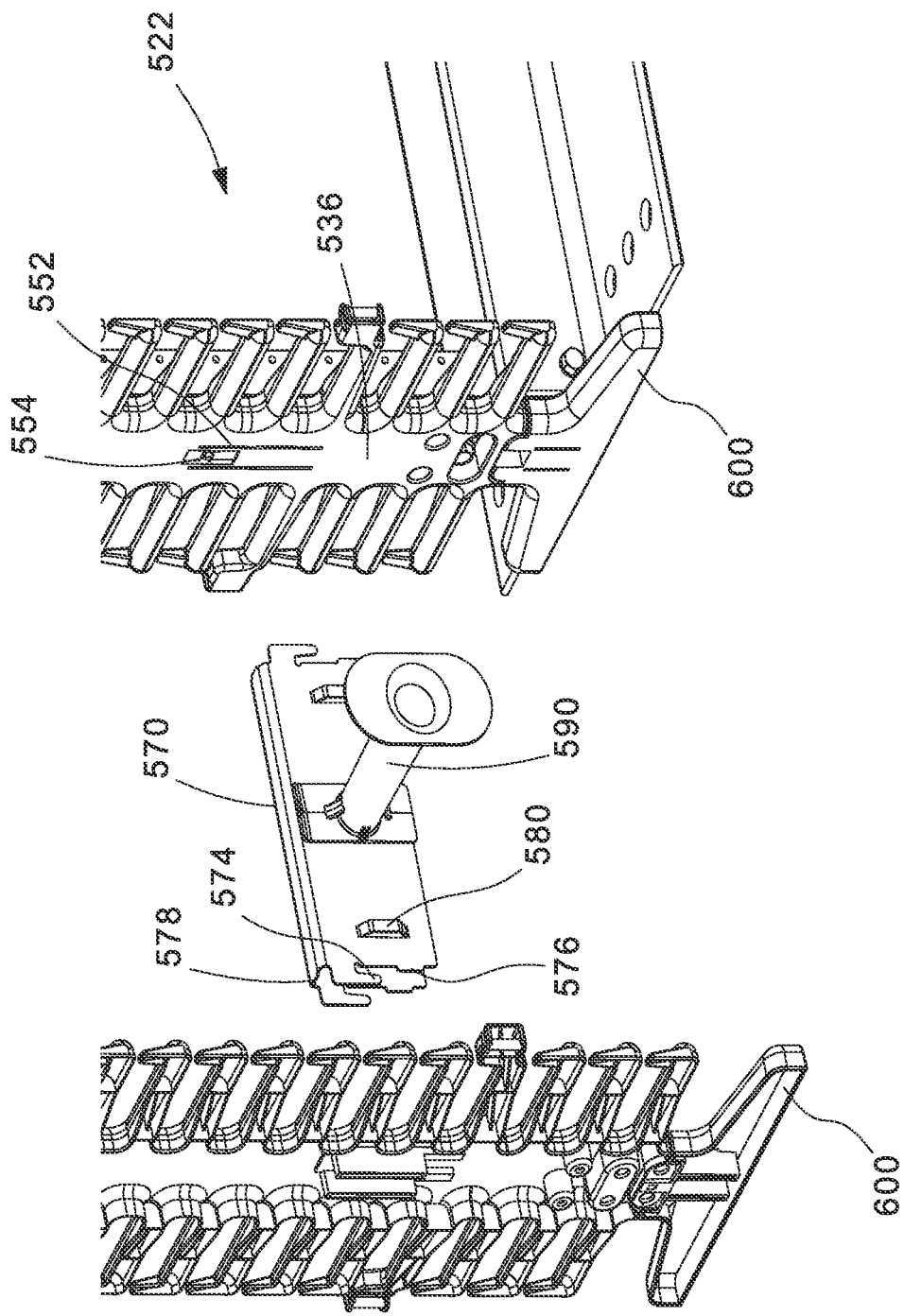
FIG. 25 is a perspective partially exploded view of the finger segments and cross member of the vertical cable manager of FIG. 19.
Figure 26:
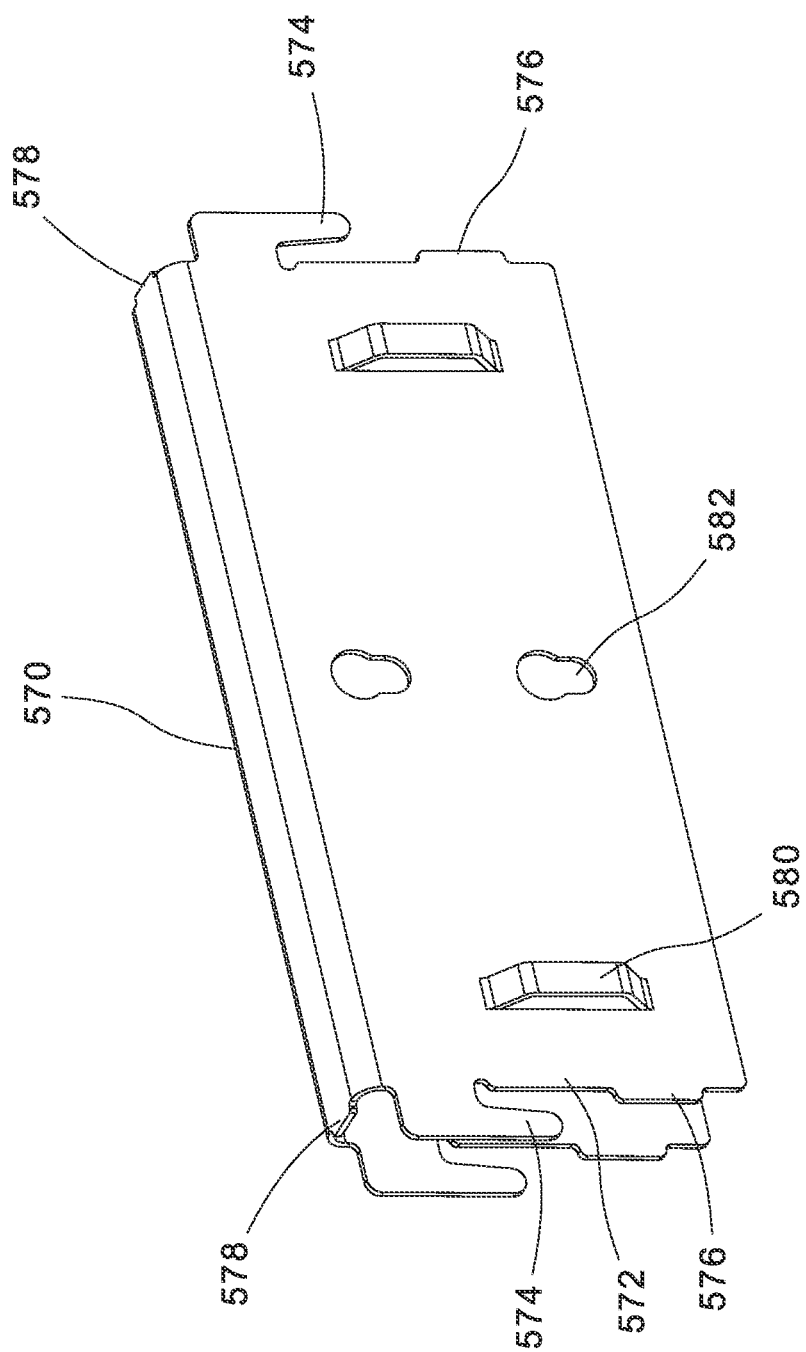
FIG. 26 is a perspective view of the cross member of the vertical cable manager of FIG. 25.
Figure 27:
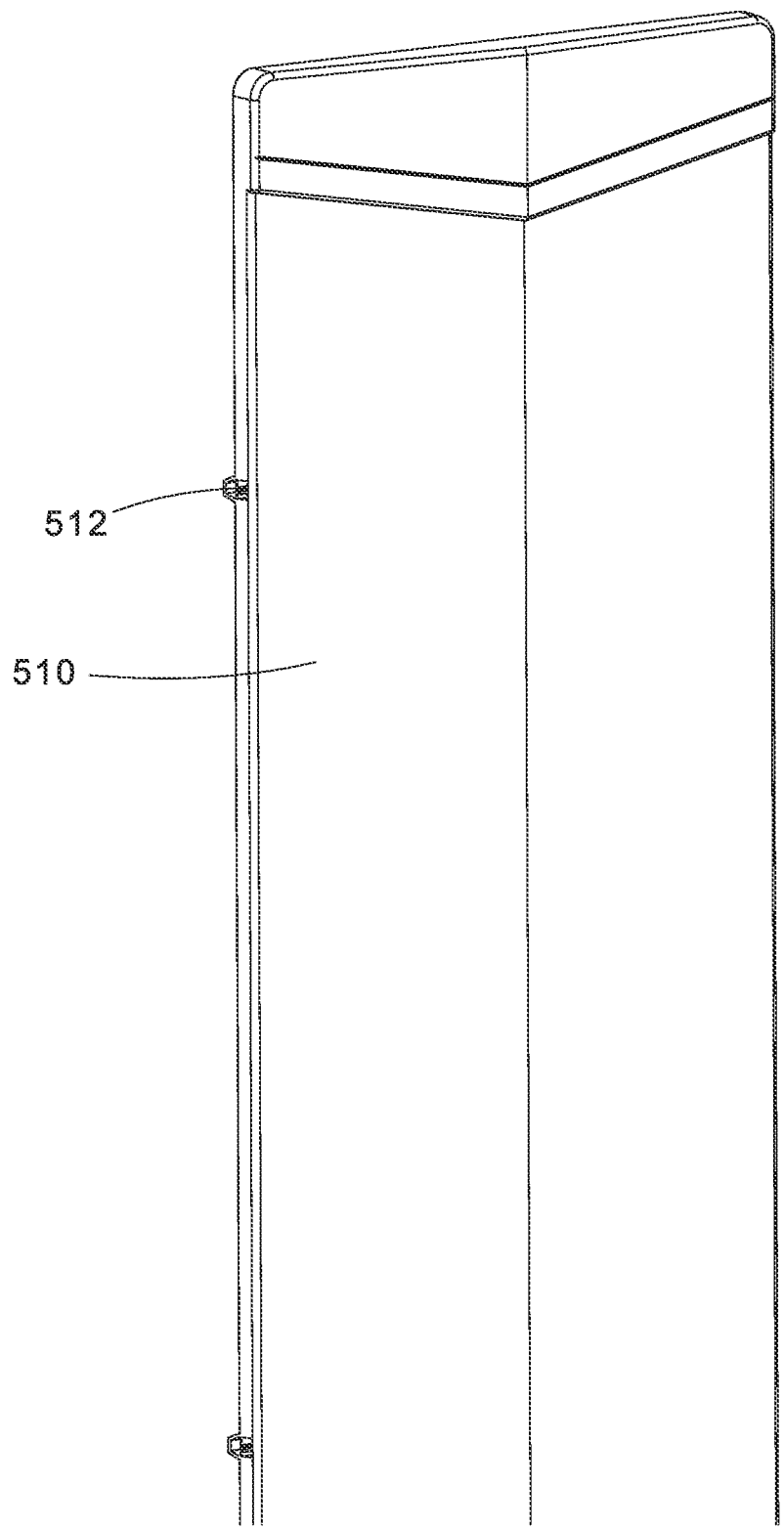
FIG. 27 is a perspective view of the outside door of the vertical cable manager of FIG. 18.
Figure 28:
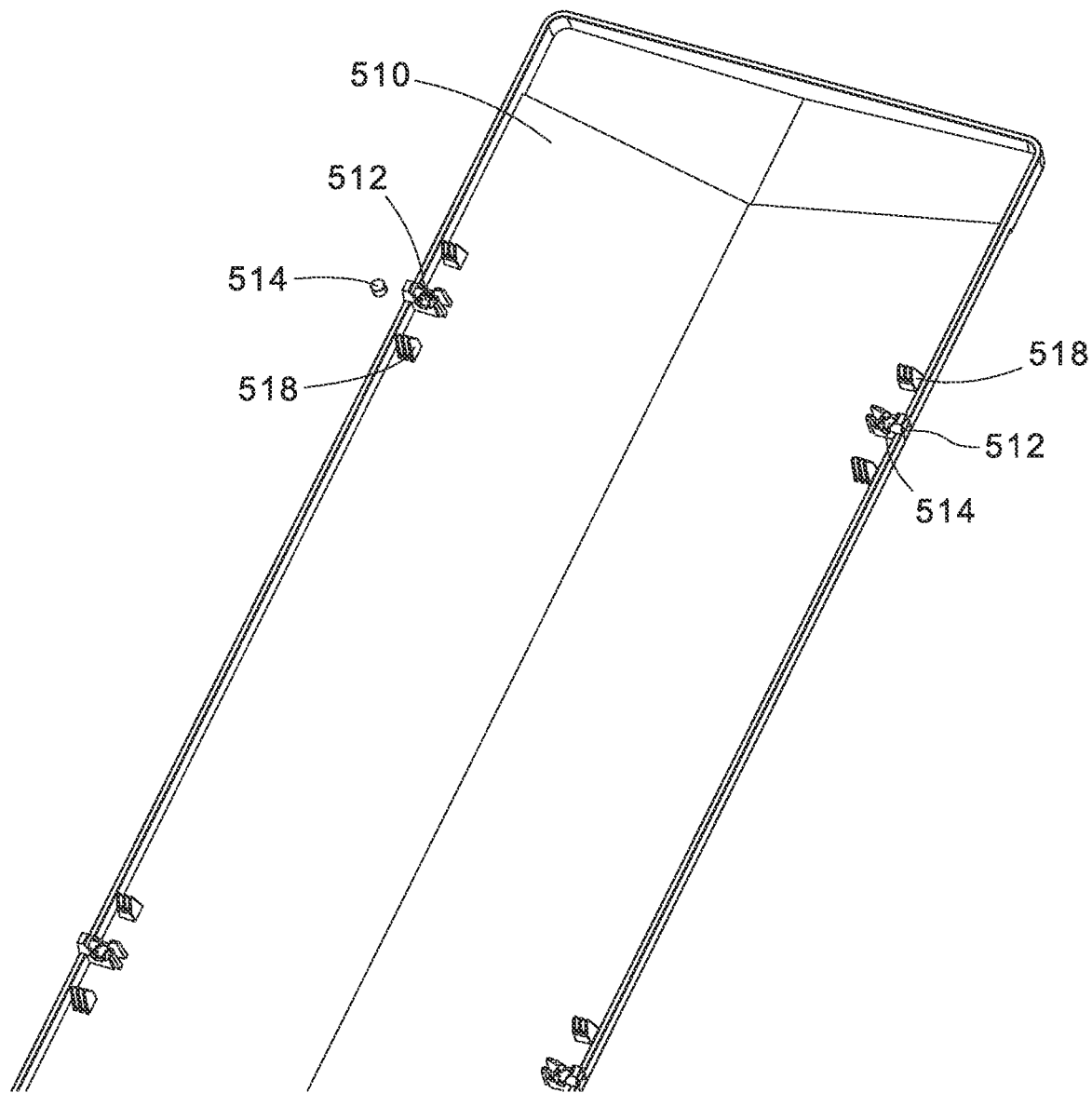
FIG. 28 is a perspective view of the inside of the door of FIG. 27.

The cross members 570 can include, but are not limited to, additional features such as bridge forms 580 to use with cable management cable ties or hook and loop ties and mounting apertures 582 for cable management accessories, such as a slack spool 590 (see FIG. 25).

FIGS. 27-30 illustrate the doors 510 of the present invention and the installation of the doors 510 on the vertical cable manager's finger assemblies 520. Similar to the door 190 of the horizontal cable manager 150, the doors 510 of the vertical cable manager include a magnetic hinge that improves the functionality of the door 510 by allowing the vertical cable manager 500 to be easily opened and closed while providing a direct attachment to the network rack 50.

The outside of the door 510 includes design elements such as a pentagon with two right angles and chevron character line. The inside of the door 510 includes magnet pockets or receptacle 512 with magnets 514 inserted therein. Pin guides 516 help to position the magnet pockets 512 against the metallic hinge pins 546 held by the hinge flag 544 of the hinge fingers 542. Door guides 518 help position the door 510 vertically at the end of the hinge fingers 542.

Figure 29:
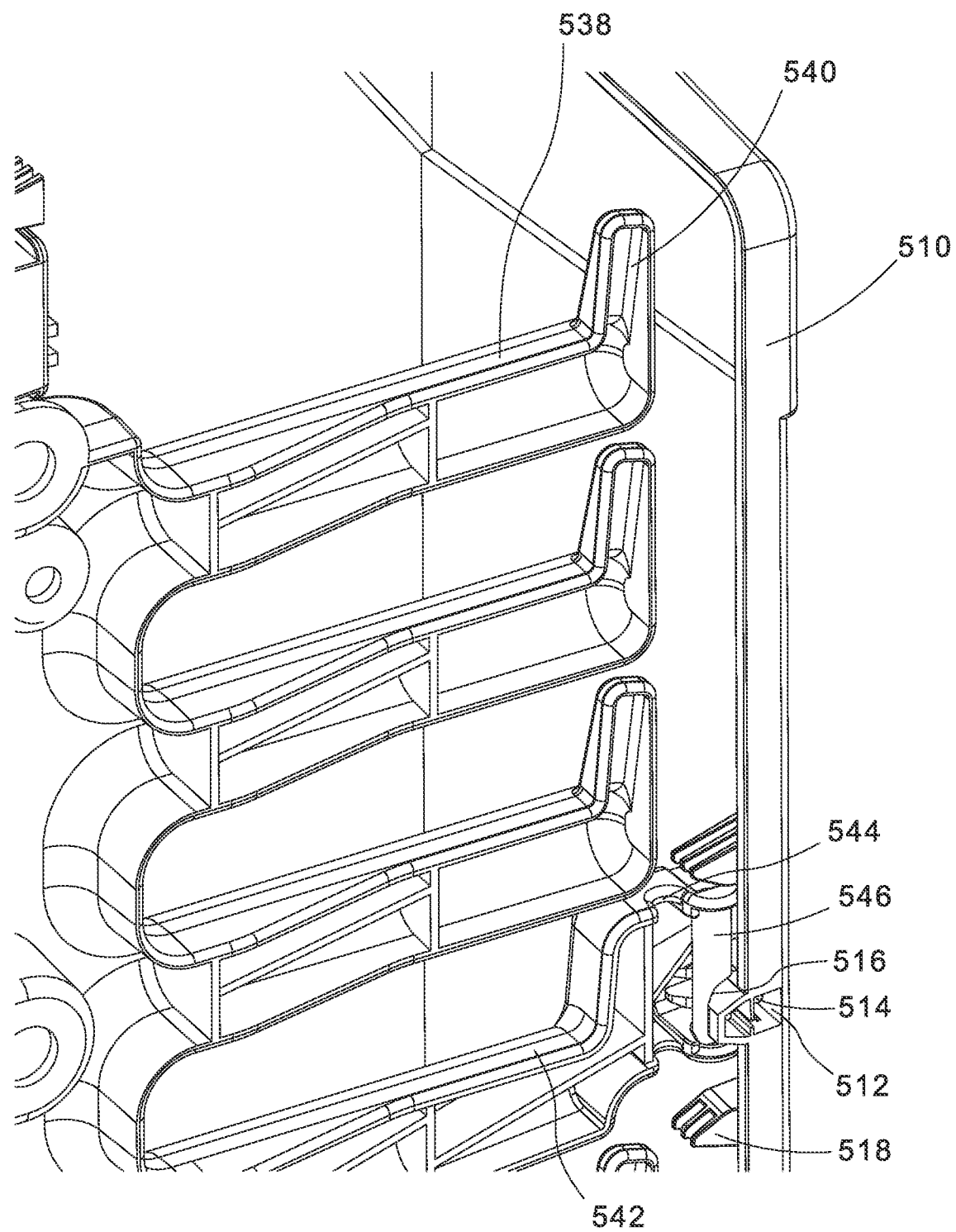
FIG. 29 is a partial perspective view of a finger segment of the vertical cable manager of FIG. 18 engaging the door.
Figure 30:
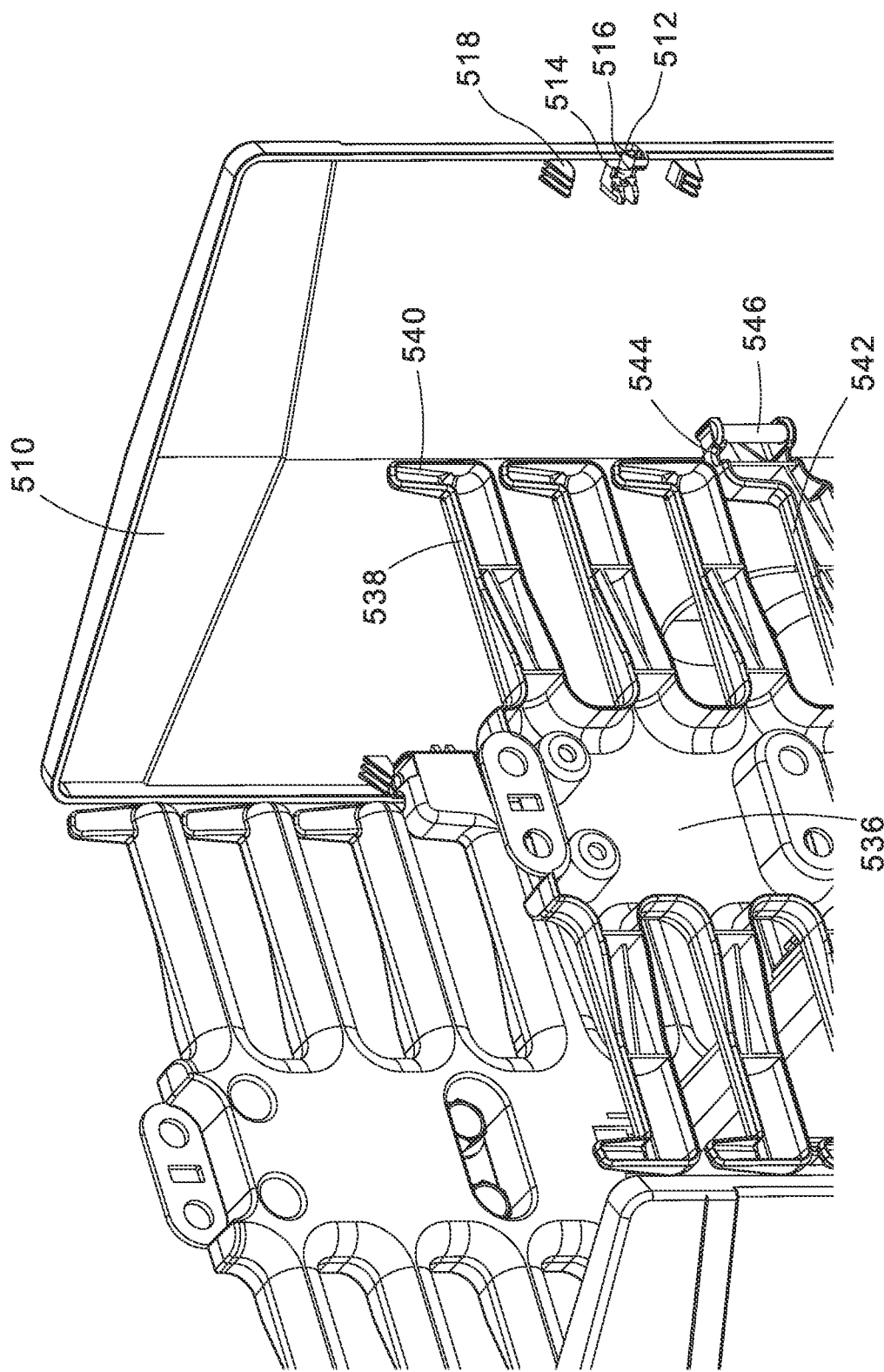
FIG. 30 is a partial perspective view of the finger segment of the vertical cable manager of FIG. 29 with the door disengaged.

FIG. 29 illustrates a detailed view of the magnetic hinges with the vertical cable manager door 510 in a closed position. FIG. 30 illustrates a detailed view of the magnetic hinges with the vertical cable manager door 510 in an open position. The magnetic hinges function like those found in the horizontal cable manager 190, as described above, but in a vertical orientation. Magnets 514 on the door 510 are magnetically attached to hinge pins 546 on hinge fingers 542 of the finger segment 522. When one side of the door 510 is pulled with sufficient force, the magnetic connection on that side of the door 510 is overcome and the door 510 will rotate open around the magnets 514 and hinge pins 546 on the opposite side. Closing the door 510 brings magnets 514 and hinge pins 546 together and the magnetic attraction holds the door 510 in the closed position. Complete removal of the door 510 is achieved by pulling on both sides of door 510 simultaneously so that the magnetic attraction is simultaneously defeated on both sides.

The modular construction of the finger assembly allows for varying widths by using different widths of the cross member. The overall width can vary between but is not limited to 6-inch, 8 inch, and 10 inch widths. The door is constructed at a dedicated width so the door width must match the width of the finger assembly.

Furthermore, while the preferred embodiments of the present invention have been shown and described, it will be obvious to those skilled in the art that changes, and modifications may be made without departing from the teaching of the invention. The matter set forth in the foregoing description and accompanying drawings is offered by way of illustration only and not as limitation.

The invention claimed is:

1. A cable manager for routing cables in a network rack, the cable manager comprising:
   a body with a plurality of fingers extending from the body, wherein a distal end of at least one finger has a hinge pin holder; and
   a door hingedly attached to the plurality of fingers extending from the body, the door having a front, a back, and at least one hinge pin receptacle positioned along at least one edge of the door, the hinge pin receptacle housing a magnet for enabling the door to attach to the hinge pin holder of the at least one finger to hold the door in a closed position.

2. The cable manager of claim 1, wherein the hinge pin holder is a U-shaped member and the U-shaped member holds a hinge pin.

3. The cable manager of claim 2, wherein the magnet and the hinge pin form a magnetic hinging mechanism for enabling the door to attach to the body, whereby the magnetic hinging mechanism allows for the door to be opened when engaged from the at least one edge of the door.

4. The cable manager of claim 2, wherein the hinge pin receptacle and the hinge pin holder allow the door to be opened and rotated up to 190 degrees around the hinge pin.

5. The cable manager of claim 1, wherein the cable manager is a horizontal cable manager.

6. The cable manager of claim 1, wherein the cable manager is a vertical cable manager.

7. A vertical cable manager for routing cable in a network rack, the vertical cable manager comprising: finger assemblies including vertically joined finger segments, wherein the vertically joined finger segments having a center spine with a plurality of fingers and a plurality of hinged fingers extending from at least one edge of the center spine; cross members laterally joining finger assemblies; and doors hingedly attached to the plurality of hinged fingers extending from the center spine of the vertically joined finger segments, wherein the vertically joined finger segments include a lower vertical connection and an upper vertical connection; the lower vertical connection including mounting holes and a snap and the upper vertical connection including mounting holes and a vertical joining receptacle; whereby the snap engages the vertical joining receptacle to vertically join finger segments and fasteners are installed through the mounting holes to secure the vertically joined finger segments.

8. The vertical cable manager of claim 7, further comprising at least one base secured to at least one finger assembly for stabilizing the vertical cable manager.

9. The vertical cable manager of claim 7, wherein the center spine further comprising cross member slots and locking snaps for receiving the cross members.

10. The vertical cable manager of claim 9, wherein the cross members have connection tabs, and stabilizing tabs that engage the cross-member slots in the center; spine and the cross members have locking tabs that engage the locking snaps in the center spine to prevent disengagement of the cross members from the finger assemblies.

11. A vertical cable manager for routing cable in a network rack, the vertical cable manager comprising:
    finger assemblies including vertically joined finger segments, wherein the vertically joined finger segments having a center spine with a plurality of fingers and a plurality of hinged fingers extending from at least one edge of the center spine;
    cross members laterally joining finger assemblies;
    doors hingedly attached to the plurality of hinged fingers extending from the center spine of the vertically joined finger segments;
    wherein each of the plurality of fingers have an upturned flag at a distal end of the plurality of fingers and each of the plurality of hinged fingers have a hinge flag at a distal end of the plurality of hinged fingers, wherein the hinge flags hold a hinge pin for interacting with the door; and
    wherein the door includes magnet pockets with magnets installed therein to enable the door to attach to the hinge pin in the hinge flag of the plurality of hinged fingers to hold the door in a closed position.

12. The vertical cable manager of claim 11, wherein the door further comprising pin guides for positioning the magnet pockets against the hinge pins held by the hinge flags of the plurality of hinge fingers.

13. The vertical cable manager of claim 11, wherein the door further comprising door guides for positioning the door vertically at the end of the plurality of hinge fingers.

* * * * *